(12) United States Patent
Kang

(10) Patent No.: US 12,040,005 B2
(45) Date of Patent: Jul. 16, 2024

(54) SEMICONDUCTOR DEVICE

(71) Applicant: SAMSUNG ELECTRONICS CO., LTD., Suwon-si (KR)

(72) Inventor: Gyuseong Kang, Goyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 166 days.

(21) Appl. No.: 17/870,545

(22) Filed: Jul. 21, 2022

(65) Prior Publication Data

US 2023/0178132 A1    Jun. 8, 2023

(30) Foreign Application Priority Data

Dec. 6, 2021   (KR) .................. 10-2021-0172935
Feb. 23, 2022  (KR) .................. 10-2022-0023826

(51) Int. Cl.
 *G11C 11/16*     (2006.01)
(52) U.S. Cl.
 CPC ...... *G11C 11/1673* (2013.01); *G11C 11/1655* (2013.01); *G11C 11/1657* (2013.01)
(58) Field of Classification Search
 CPC ............ G11C 11/1673; G11C 11/1655; G11C 11/1657; G11C 11/1659
 See application file for complete search history.

(56) References Cited

U.S. PATENT DOCUMENTS

| | | | |
|---|---|---|---|
| 6,678,189 B2 | 1/2004 | Tran | |
| 7,245,526 B2 | 7/2007 | Oh et al. | |
| 7,474,132 B2 | 1/2009 | Cheng | |
| 9,478,302 B2 | 10/2016 | Park | |
| 10,453,532 B1 | 10/2019 | Antonyan | |
| 10,910,030 B2 | 2/2021 | Antonyan et al. | |
| 2008/0170441 A1* | 7/2008 | Pelli ...................... | G11C 16/28 365/185.21 |
| 2013/0148423 A1* | 6/2013 | Ueda ...................... | G11C 16/24 365/185.2 |
| 2021/0312979 A1 | 10/2021 | Allers et al. | |

* cited by examiner

*Primary Examiner* — Han Yang
(74) *Attorney, Agent, or Firm* — Sughrue Mion, PLLC

(57) ABSTRACT

A semiconductor device includes a first memory cell array including a plurality of first memory cells, a plurality of first reference cells and a plurality of first dummy cells, a second memory cell array including a plurality of second memory cells, a plurality of second reference cells and a plurality of second dummy cells, an input/output circuit provided between the first memory cell array and the second memory cell array, a first column decoder connected between the first memory cell array and the input/output circuit and a second column decoder connected between the second memory cell array and the input/output circuit. The second column decoder connects one of the plurality of second dummy cells and the plurality of second memory cells to a selected sense amplifier of the input/output circuit, when the first column decoder connects a selected first memory cell to the selected sense amplifier.

20 Claims, 16 Drawing Sheets

SEMICONDUCTOR DEVICE

CROSS-REFERENCE TO RELATED APPLICATION(S)

This application is based on and claims priority under 35 USC 119(a) from Korean Patent Application No. 10-2021-0172935 filed on Dec. 6, 2021, and Korean Patent Application No. 10-2022-0023826 filed on Feb. 23, 2022, in the Korean Intellectual Property Office, the entire disclosures of which are incorporated herein in their entirety by reference.

BACKGROUND

1. Field

The disclosure relates to a semiconductor device and a method for compensating for a leakage current.

2. Description of the Related Art

A semiconductor device may have a function of writing and erasing data, or to read the recorded data. The semiconductor device may include a plurality of memory cells, and may write data by adjusting a threshold voltage of each of the memory cells. Each of the memory cells may include a memory element having a different resistance value based on a write operation. In a memory cell array of the semiconductor device, two or more memory cells may share a word line and a bit line with each other, and accuracy of a read operation may be lowered due to a leakage current flowing to memory cells which are not selected in the read operation.

SUMMARY

Example embodiments provide a semiconductor device having improved reliability of a read operation by compensating for an effect of a leakage current flowing to unselected memory cells which are not selected in the read operation.

According to an aspect of the disclosure, there is provided a semiconductor device including a first memory cell array comprising a plurality of first memory cells, a plurality of first reference cells and a plurality of first dummy cells, a second memory cell array comprising a plurality of second memory cells, a plurality of second reference cells and a plurality of second dummy cells, an input/output circuit provided between the first memory cell array and the second memory cell array, a first column decoder configured to electrically connect the first memory cell array and the input/output circuit and a second column decoder configured to electrically connect the second memory cell array and the input/output circuit, wherein the second column decoder is configured to connect at least one of the plurality of second dummy cells and the plurality of second memory cells to a selected sense amplifier, among a plurality of sense amplifiers of the input/output circuit, when the first column decoder connects a selected first memory cell, among the plurality of first memory cells, to the selected sense amplifier.

According to another aspect of the disclosure, there is provided a semiconductor device including: a memory cell array including a plurality of memory cells and a plurality of reference cells, the plurality of reference cells having a first structure different from a second structure of the plurality of memory cells, a column decoder connected to the plurality of memory cells through a plurality of bit lines extended in a first direction, and connected to the plurality of reference cells through a plurality of reference bit lines extended in the first direction and an input/output circuit including at least one sense amplifier connected to the memory cell array through the column decoder, wherein the sense amplifier includes a first input terminal configured to connect to a selected bit line, among the plurality of bit lines through the column decoder, and a second input terminal configured connect to a selected reference bit line, among the plurality of reference bit lines, through the column decoder, wherein the second input terminal is configured to connect to the selected reference bit line through a first reference resistor and a second reference resistor, and wherein a dummy bit line, other than the plurality of bit lines and the plurality of reference bit lines, is configured to be connected to a node between the first reference resistor and the second reference resistor.

According to another aspect of the disclosure, there is provided a semiconductor device including: a plurality of memory cells each including a switch element and a memory element; a plurality of reference cells having a first structure different than a second structure of the plurality of memory cells, a plurality of dummy cells having a third structure same as the second structure of plurality of memory cells and a sense amplifier having a first input terminal configured to connect to a selected memory cell and a second input terminal configured to connect to the plurality of reference cells and the plurality of dummy cells, during a read operation for the selected memory cell, among the plurality of memory cells, wherein a selected word line connected to the selected memory cell is connected to one of the plurality of reference cells and disconnected from the plurality of dummy cells.

According to another aspect of the disclosure, there is provided a semiconductor device including: a first memory cell array comprising a plurality of first memory cells and a plurality of first reference cells, a second memory cell array comprising a plurality of second memory cells and a plurality of second reference cells, an output circuit comprising a first input terminal, a second input terminal and an output terminal, a first column decoder connected between the first memory cell array and the output circuit and a second column decoder connected between the second memory cell array and the output circuit, wherein, in a read operation, the second column decoder is configured to electrically connect a second memory cell, among the plurality of second memory cells in the second memory cell array, to the second input terminal of the output circuit, based on a first memory cell, among the plurality of first memory cells in the first memory cell array, being connected to the first input terminal of the output circuit through the first column decoder.

BRIEF DESCRIPTION OF DRAWINGS

The above and other aspects, features, and advantages of the disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
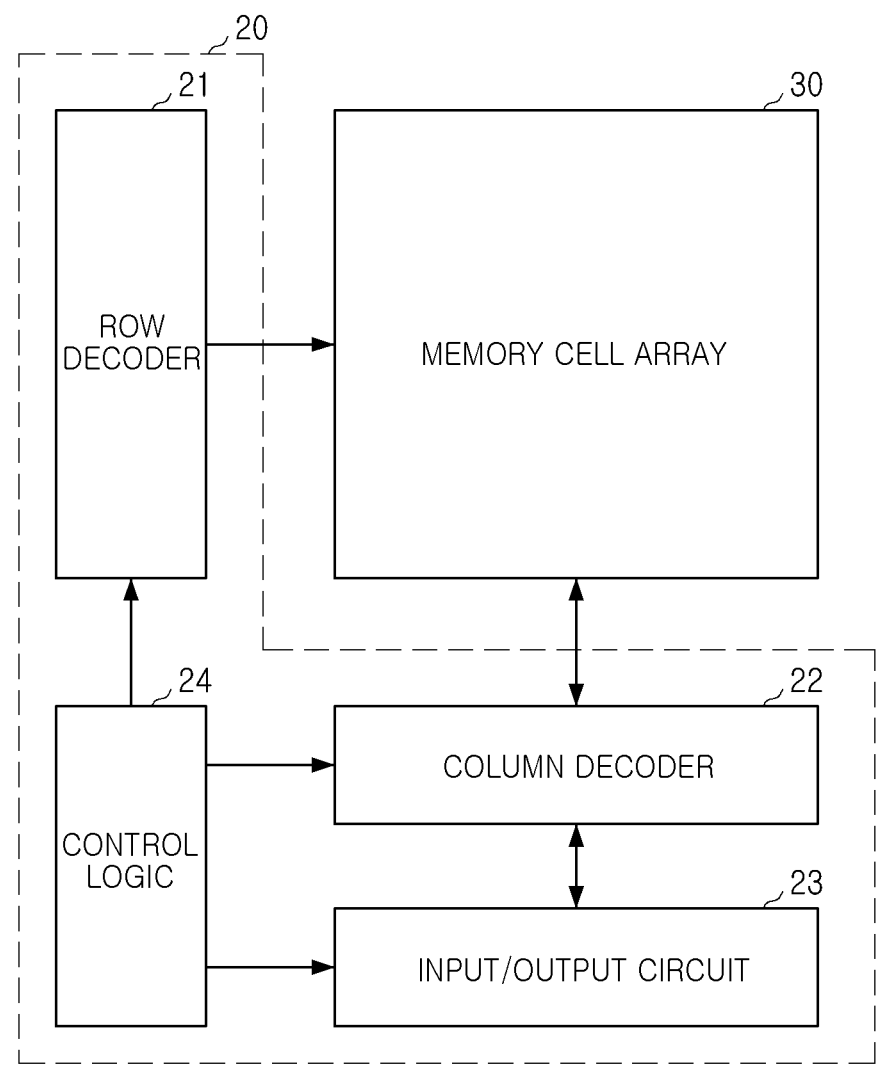
FIG. 1 is a block diagram illustrating a semiconductor device according to an example embodiment of the disclosure.

FIG. 1 is a block diagram illustrating a semiconductor device according to an example embodiment of the disclosure.

The semiconductor device 10 according to an example embodiment of the disclosure may include a peripheral circuit region 20 and a cell region 30. The peripheral circuit region 20 may include a row decoder 21, a column decoder 22, an input/output circuit 23, e.g., an input and output circuit, a control logic 24 and the like. The cell region 30 may include memory cell arrays, and each of the memory cell arrays may include a plurality of memory cells. According to an example embodiment, the input/output circuit 23 may be an output circuit having one or more input terminals and one or more output terminals. However, the disclosure is not limited thereto, and as such, the input/output circuit 23 according to another example embodiment may have a various configurations of input and output terminals.

The row decoder 21 may be connected to the plurality of memory cells through word lines WL, and the column decoder 22 may be connected to the plurality of memory cells through bit lines BL and source lines SL. The input/output circuit 23 may be selectively connected to or disconnected from the plurality of memory cells through the column decoder 22, and may execute a read operation for reading data of a selected memory cell of the plurality of memory cells, a write operation for recording data to the selected memory cell or the like.

The control logic 24 may control operations of the row decoder 21, the column decoder 22 and the input/output circuit 23. The control logic 24 may determine the selected memory cell of the memory cells included in the cell region 30 through the row decoder 21 and the column decoder 22. The control logic 24 may execute the write operation, the read operation or the like on the selected memory cell by inputting a predetermined bias to each of a selected word line, a selected bit line, and a selected source line, which are connected to the selected memory cell.

Each of the plurality of memory cells included in the cell region 30 may include a memory element which stores data based on a change in resistance. According to an example embodiment, each of the plurality of memory cells may include a switch element connected to the memory element, and a control terminal of the switch element may be connected to the row decoder 21 through one of the word lines WL.

In the cell region 30, two or more of the plurality of memory cells may share one of the bit lines BL and one of the source lines SL with each other. Therefore, in the read operation for reading the data of the selected memory cell, a leakage current flowing into at least one unselected memory cell sharing the selected bit line with the selected memory cell may be added in the selected bit line connected to the selected memory cell in addition to a current of the selected memory cell. As such, the leakage current may lower accuracy of the read operation of the semiconductor device 10.

In an example embodiment of the disclosure, an effect of the leakage current may be compensated through a dummy cell and/or unselected memory cell provided in an unselected memory cell array different from a selected memory cell array in which the selected memory cells are disposed. Therefore, it is possible to accurately compensate for the effect of the leakage current in the read operation and improve a performance of the semiconductor device 10 without separately detecting parameters such as a temperature and an elapsed time after an execution of a program that may affect a magnitude of the leakage current.

Figure 2:
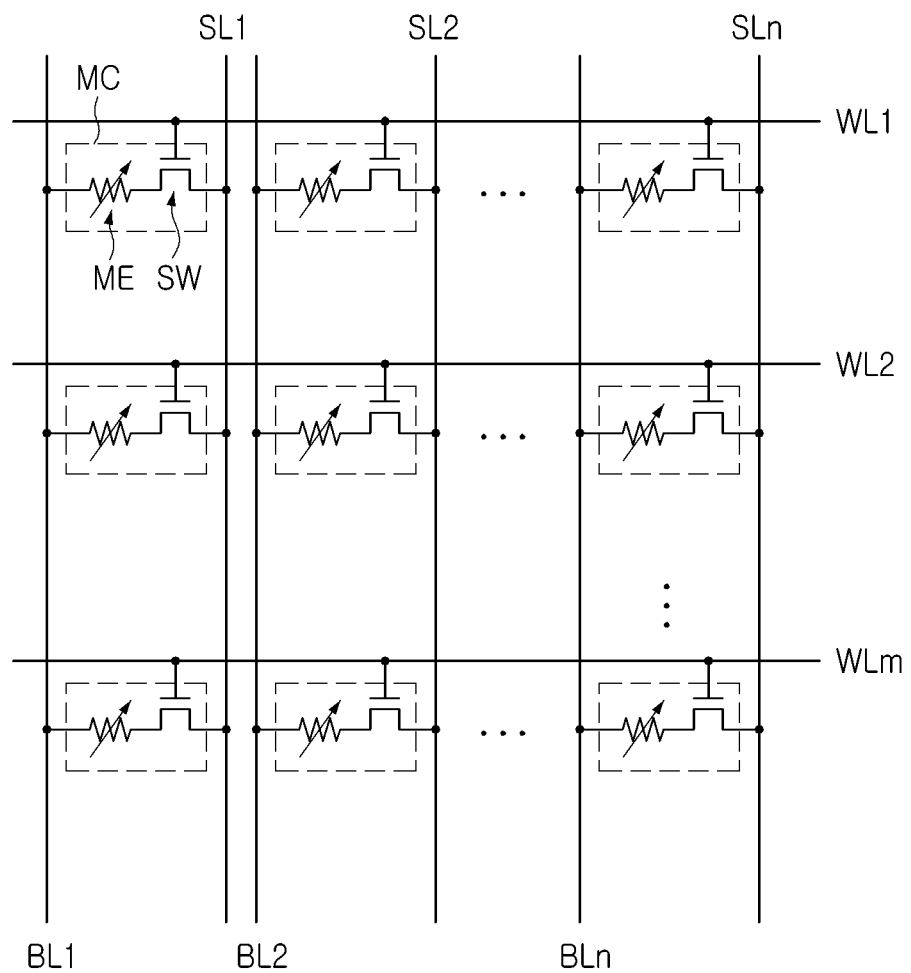
FIGS. 2 and 3 are diagrams illustrating a memory cell array included in the semiconductor device according to an example embodiment of the disclosure.
Figure 3:
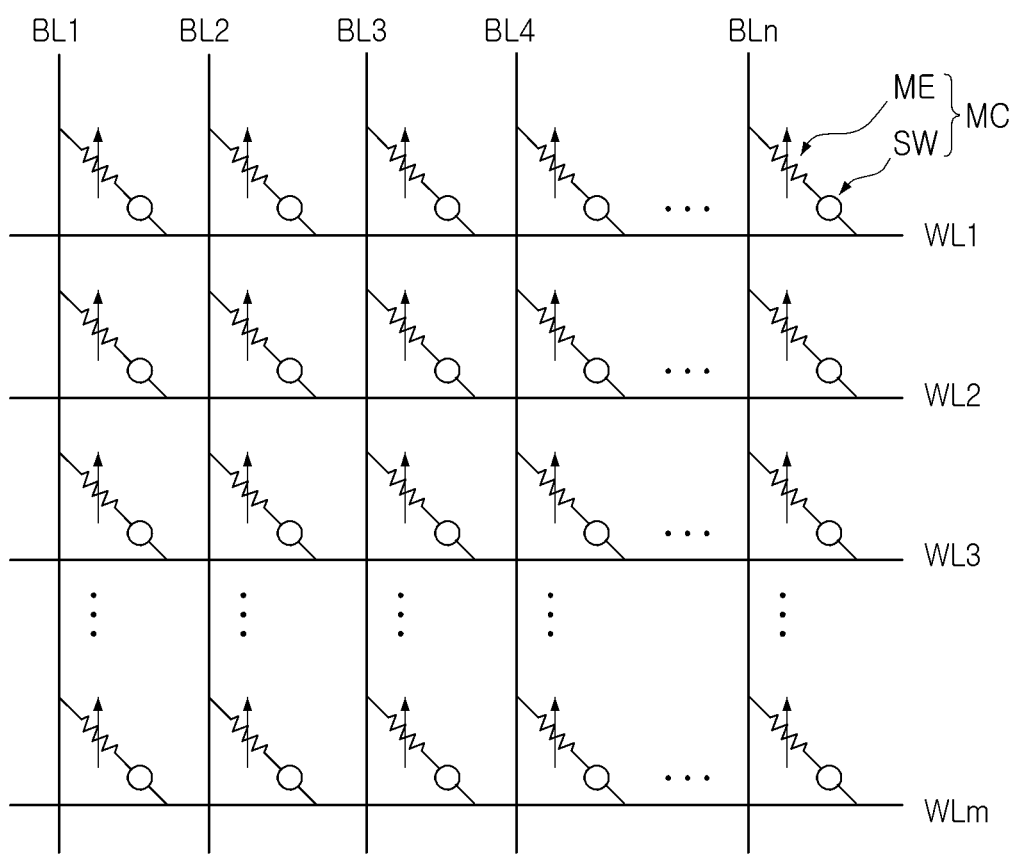

FIGS. 2 and 3 are diagrams illustrating a memory cell array included in the semiconductor device according to an example embodiment of the disclosure.

Referring to FIG. 2, a memory cell array 40 according to an example embodiment of the disclosure may include a plurality of memory cells MC, and each of the plurality of memory cells MC may include a switch element SW and a memory element ME. The plurality of memory cells MC may be connected to the row decoder described above with reference to FIG. 1 through a plurality of word lines WL1 to WLm. Meanwhile, the plurality of memory cells MC may be connected to the column decoder described above with reference to FIG. 1 through a plurality of bit lines BL1 to BLn and a plurality of source lines SL1 to SLn.

In an example embodiment described with reference to FIG. 2, the switch element SW included in each of the plurality of memory cells MC may be implemented as a transistor, and the memory element ME may be implemented as a variable resistor. For example, resistance of the memory element ME may be increased or reduced by a voltage/current input through the plurality of bit lines BL1 to BLn and the plurality of source lines SL1 to SLn while the switch element SW is turned on. In an example embodiment, the memory element ME may be implemented as a magnetic tunnel junction (MTJ) element. The description describes a detailed operation of the memory cell MC including the magnetic tunnel junction element below.

Meanwhile, referring to FIG. 3, a memory cell array 50 according to an example embodiment of the disclosure may include the plurality of memory cells MC, and the plurality of memory cells MC may be connected to the plurality of word lines WL1 to WLm and the plurality of bit lines BL1 to BLn. Each of the plurality of memory cells MC may include the switch element SW and the memory element ME, and may write data into each of the plurality of memory cells MC by using the change in resistance of the memory element ME, as described above with reference to FIG. 2.

In an example embodiment described with reference to FIG. 3, the switch element SW may be implemented as an element other than a transistor, for example, a diode or an ovonic threshold switch element. Meanwhile, the memory element ME may include a material undergoing a phase change based on a voltage applied thereto, for example, Ge—Sb—Te (GST). In this case, the semiconductor device including the memory cell array 50 may be referred to as a parameter random access memory (parameter RAM, PRAM). When the memory element ME includes a pair of electrodes and a transition metal oxide disposed therebetween, the semiconductor device may be referred to as a resistive RAM (ReRAM). In addition, when the memory element ME is implemented as the magnetic tunnel junction element as described above, the semiconductor device may be referred to as a magnetic RAM (MRAM).

As described with reference to FIGS. 2 and 3, two or more memory cells MC in the memory cell array 40 or 50 may share one of the plurality of bit lines BL1 to BLn with each other. The plurality of bit lines BL1 to BLn may be connected to the input/output circuit through the column decoder of the peripheral circuit region. For example, in the read operation, the column decoder may connect the selected bit line connected to the selected memory cell to a sense amplifier of the input/output circuit.

In the read operation, the semiconductor device may determine a resistance of the memory element ME included in the selected memory cell by comparing a read current flowing through the selected memory cell with a reference current. The reference current may be predetermined. For example, the memory element ME may be a GST element. In this case, it may be determined that the memory element ME is in a crystalline state when the read current flowing through the selected memory cell is less than the reference current, and it may be determined that the memory element ME is in an amorphous state when the read current is greater than the reference current. Meanwhile, the memory element ME may be the magnetic tunnel junction element. In this case, it may be determined that the fixed layer and free layer of the memory element ME may have magnetization directions opposite to each other when the read current is greater than the reference current, and it is determined that the fixed layer and free layer of the memory element ME may have the same magnetization directions as each other when the read current is less than the reference current.

However, in an actual read operation, a leakage current flowing through another unselected memory cell connected to the same selected bit line as the selected memory cell may be added to the current flowing to the selected memory cell. Accordingly, the read current input to the sense amplifier may correspond to a sum of the current of the selected memory cell and the leakage current of the unselected memory cell. For example, the higher an ambient temperature at a time point of executing the read operation, the greater the magnitude of leakage current and the lower the accuracy of the read operation.

In an example embodiment of the disclosure, the unselected memory cell array may be used to address a leakage current flowing through another unselected memory cell in the selected memory cell array including the selected memory cell. For example, the leakage current may be added to the reference current by connecting the dummy cells or memory cells included in the unselected memory cell array to an input terminal of the sense amplifier, to which the reference current is input. Therefore, it is possible to compensate for the effect of the leakage current and improve the performance of the semiconductor device without any separate circuit for sensing the temperature which may affect the magnitude of the leakage current or the like.

Figure 4:
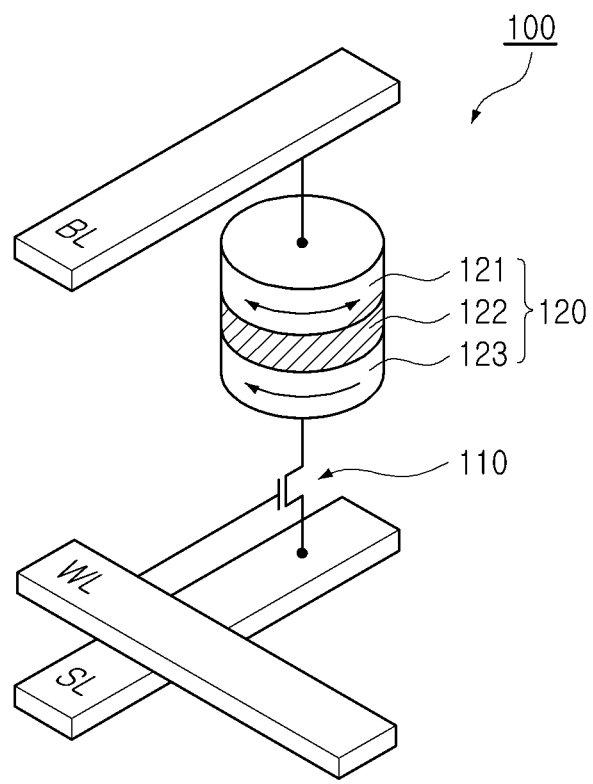
FIG. 4 is a diagram schematically illustrating the memory cell included in the semiconductor device according to an example embodiment of the disclosure.
Figure 5A:
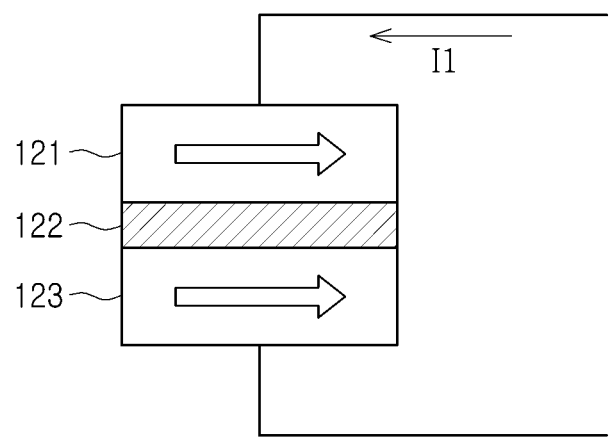
FIGS. 5A and 5B are diagrams illustrating an operation of the memory cell included in the semiconductor device according to an example embodiment of the disclosure.
Figure 5B:
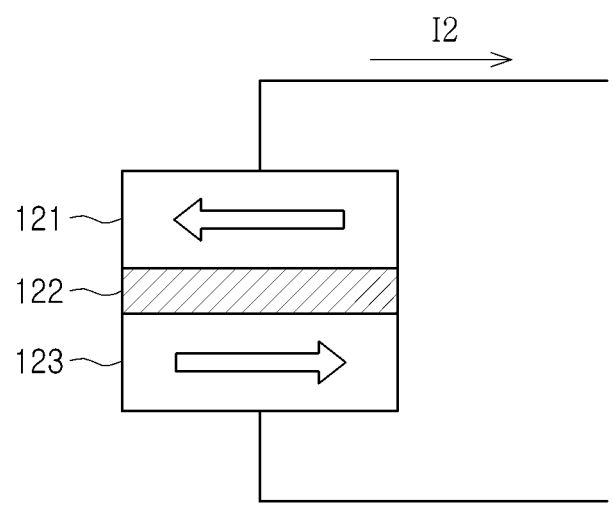

FIG. 4 is a diagram schematically illustrating the memory cell included in the semiconductor device according to an example embodiment of the disclosure; and FIGS. 5A and 5B are diagrams illustrating an operation of the memory cell included in the semiconductor device according to an example embodiment of the disclosure.

Referring to FIG. 4, a memory cell 100 may include a switch element 110 and a memory element 120. The switch element 110 may be implemented as the transistor. For example, a gate terminal of the transistor may be connected to the word line WL. A source terminal of the transistor may be connected to the source line SL, and a drain terminal of the transistor may be connected to the bit line BL through the memory element 120.

The memory element 120 may include a free layer 121, a fixed layer 123 and a tunnel layer 122 disposed between the free layer 121 and the fixed layer 123. The magnetization direction of the fixed layer 123 may be fixed and is not changed, and the magnetization direction of the free layer 121 may be changed to be the same as or opposite to the direction of the fixed layer 123 based on conditions. According to an example embodiment, the conditions may be operating conditions or requirements for storing, reading and/or writing data to the memory element 120. In order to fix the magnetization direction of the fixed layer 123, an anti-ferromagnetic layer may be further included in the memory element 120.

Hereinafter, the description describes the read operation and record operation of the memory cell 100 with reference to FIGS. 5A and 5B. Referring to FIG. 5A, a first current I1 may be applied to the memory element 120 of the memory cell 100, and the magnetization direction of the free layer 121 may thus be set in the same direction as that of the fixed layer 123. Free electrons having a spin direction the same as the direction of the fixed layer 123 may apply a torque to the free layer 121 by the first current I1 flowing from the free layer 121 to the fixed layer 123, thereby magnetizing the free layer 121 parallel to the fixed layer 123.

On the other hand, as shown in FIG. 5B, when a second current I2 flowing to the free layer 121 from the fixed layer 123 of the memory element 120 is applied, free electrons having a spin direction opposite to the direction of the fixed layer 123 may apply a torque to the free layer 121. Accordingly, the free layer 121 may be magnetized anti-parallel to the fixed layer 123.

The memory element 120 may have a relatively small resistance when the free layer 121 and the fixed layer 123 are magnetized in parallel to each other as shown in FIG. 5A, and the memory element 120 may have a relatively large resistance when the free layer 121 and the fixed layer 123 are magnetized in anti-parallel to each other as shown in FIG. 5B. Accordingly, the magnitude of the current flowing through the memory cell 100 when the current is applied to the memory cell 100 may depend on the magnitude of the resistance of the memory element 120.

For example, data '0' may be read when the resistance of the memory element 120 is small, and data '1' may be read when the resistance of the memory element 120 is large. According to an example embodiment, data '0' may be read when the resistance of the memory element 120 is smaller than a threshold value, and data '1' may be read when the resistance of the memory element 120 is larger than a threshold value. The current applied to the memory cell 100 in the read operation may have a relatively small value compared to the first current I1 or the second current I2, applied to record data, and thus the magnetization direction of the free layer 121 may not be changed due to the current applied to the memory cell 100 in the read operation.

Meanwhile, FIGS. 4, 5A and 5B only show the memory element 120 having a horizontal magnetization direction. However, the memory cell 100 may be implemented as the magnetic tunnel junction element having a vertical magnetization direction. In addition, the memory element 120 may include an anti-ferromagnetic layer or the plurality of free layers 121 and/or fixed layers 123 when necessary.

The resistance of the memory element 120 may be affected by the ambient temperature. For example, the resistance of the memory element 120 may be reduced when the ambient temperature is increased in a state where the magnetization direction of the free layer 121 of the memory element 120 is set opposite to the magnetization direction of the fixed layer 123. Accordingly, when the read operation is executed at a relatively high temperature, the accuracy of the read operation may be lower due to a reduced resistance of the memory element 120 compared to a case where the read operation is executed at a low temperature.

In addition, as described above, the leakage current flowing through other memory cells sharing the bit line BL and the source line SL of the memory cell 100 may also be increased as the temperature is increased. Therefore, when the read operation is executed at a high temperature, the accuracy of the read operation may be lower due to an increased current flowing through the memory element 120 having the free layer 121 whose magnetization direction is set opposite to that of the fixed layer 123.

In the disclosure, the current flowing through another memory cell may be reflected into the reference current compared with the current of the memory cell 100 to eliminate the effect of the leakage current. Accordingly, even when the read operation is executed at a high temperature, data of the memory cell 100 may be determined by accurately executing the read operation.

Figure 6:
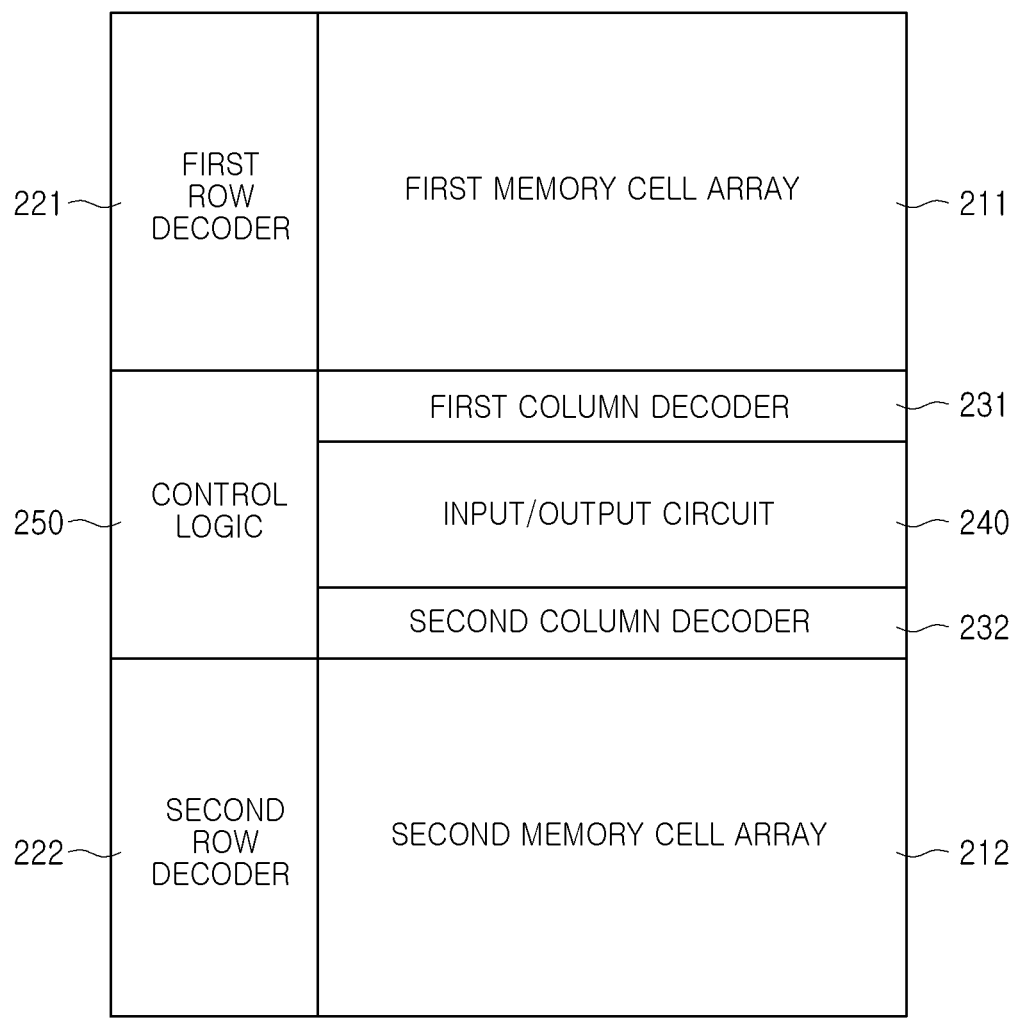
FIGS. 6 and 7 are diagrams illustrating a semiconductor device according to an example embodiment of the disclosure.
Figure 7:
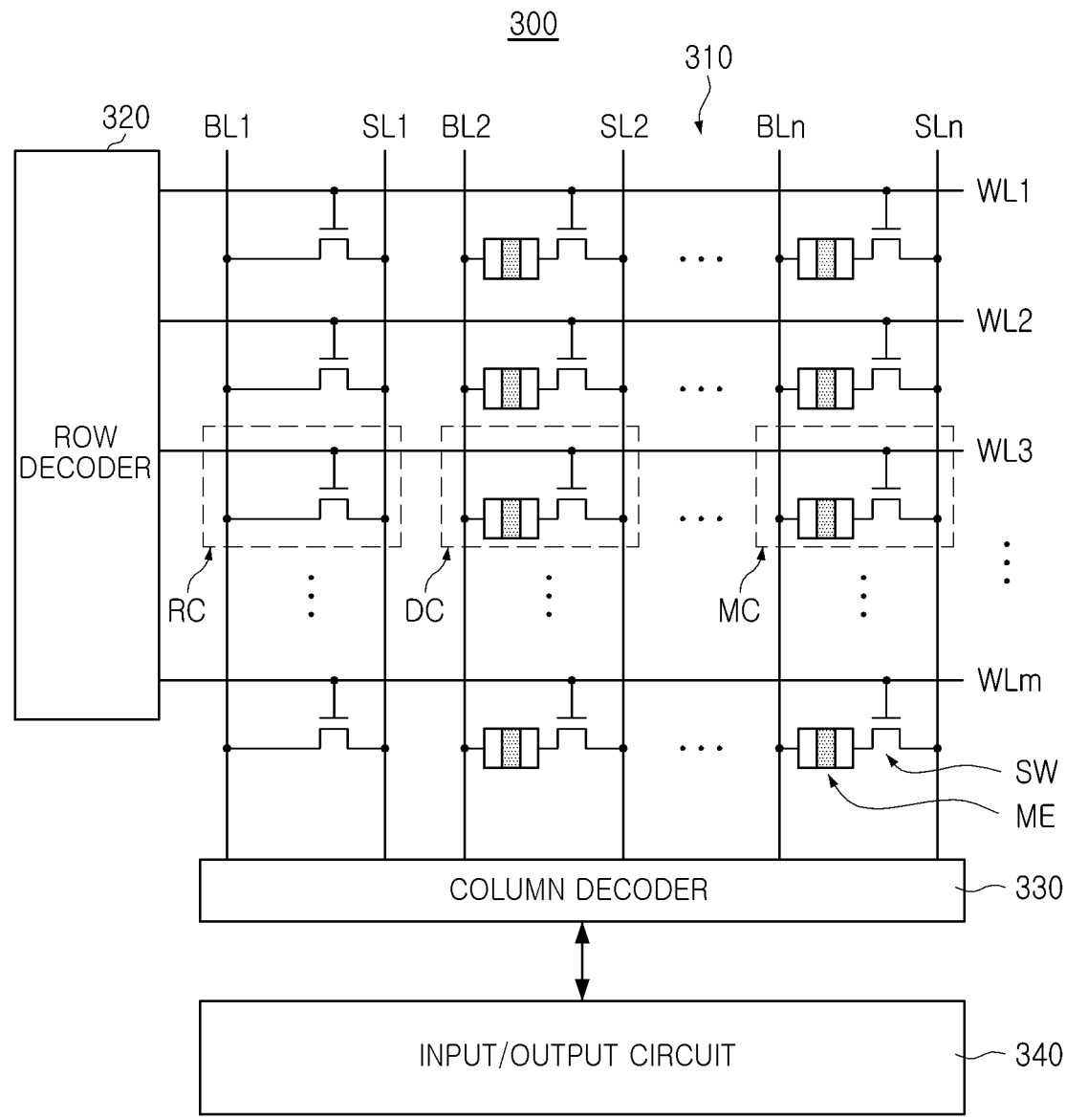

FIGS. 6 and 7 are diagrams illustrating a semiconductor device according to an example embodiment of the disclosure.

Referring to FIG. 6, a semiconductor device 200 according to an example embodiment of the disclosure may include memory cell arrays 211 and 212, row decoders 221 and 222, column decoders 231 and 232, an input/output circuit 240, a control logic 250. However, the disclosure is not limited thereto, and as such, according to another example embodiment, the semiconductor device 200 may include other components in addition to the components illustrated in FIG. 6. According to an example embodiment, the memory cell arrays may include a first memory cell array 211 and a second memory cell array 212, the row decoders may include a first row decoder 221 and a second row decoder 22, and the column decoders may include a first column decoder 231 and a second column decoder 232. The row decoders 221 and 222 may be provided on one side of the memory cell arrays 211 and 212, and the column decoders 231 and 232 and the input/output circuit 240 may be disposed between the memory cell arrays 211 and 212. According to an example embodiment, the first row decoder 221 may be provided on a first side of the first memory cell array 211 and the second row decoder 222 may be provided on a first side of the second memory cell array 212.

According to an example embodiment, the input/output circuit 240 may be disposed between the first memory cell array 211 and the second memory cell array 212 in a first direction, and the first column decoder 231 may be disposed between the input/output circuit 240 and the first memory cell array 211 in the first direction. In addition, the second column decoder 232 may be disposed between the input/output circuit 240 and the second memory cell array 212 in the first direction. The first direction may be a direction in which the plurality of bit lines connected to the plurality of memory cells of each of the memory cell arrays 211 and 212 are extended.

The input/output circuit 240 may include at least one sense amplifier which may read data of the plurality of memory cells through the plurality of bit lines or record data into the plurality of memory cells. For example, the input/output circuit 240 may be selectively connected to the first memory cell array 211 and the second memory cell array 212 through the first column decoder 231 and the second column decoder 232. Accordingly, it is possible to execute the read operation, the write operation and the like for the first memory cell array 211 and the second memory cell array 212 with one input/output circuit 240.

Meanwhile, the first row decoder 221 may be disposed on one side of the first memory cell array 211 and the second row decoder 222 may be disposed on one side of the second memory cell array 212, in a second direction intersecting the first direction. The second direction may be a direction in which the plurality of word lines connected to the plurality of memory cells of each of the memory cell arrays 211 and 212 are extended. The control logic 250 may be disposed between the first row decoder 221 and the second row decoder 222 in the first direction.

The first memory cell array 211 may include a plurality of first memory cells, a plurality of first reference cells and a plurality of first dummy cells, and the second memory cell array 212 may include a plurality of second memory cells, a plurality of second reference cells and a plurality of second dummy cells. As described above, each of the plurality of first memory cells and the plurality of second memory cells may include the switch element and the memory element, and may record data by changing the resistance of the memory element.

Referring to FIG. 7, a semiconductor device 300 according to an example embodiment of the disclosure may include a memory cell array 310, a row decoder 320, a column decoder 330, an input/output circuit 340. However, the disclosure is not limited thereto, and as such, according to another example embodiment, the semiconductor device 300 may include other components in addition to the components illustrated in FIG. 7. The memory cell array 310 may include the plurality of memory cells MC, a plurality of reference cells RC, and the plurality of dummy cells DC. According to an example embodiment, the plurality of memory cells MC may include the switch element SW and the memory element ME. The semiconductor device according to an example embodiment shown in FIG. 7 may be the MRAM, and the memory element ME may be implemented as the magnetic tunnel junction element.

The plurality of reference cells RC may include only the switch element SW, and the plurality of dummy cells DC may include both the switch element SW and the memory element ME. According to an example embodiment, it is possible to solve a problem of process deviation or the like by arranging the plurality of dummy cells DC having the same structure as the plurality of memory cells MC between the plurality of reference cells RC including only the switch element SW and the plurality of memory cells MC. For example, in a direction in which the plurality of word lines WL1 to WLm are extended, the plurality of dummy cells DC may be disposed between the plurality of reference cells RC and the plurality of memory cells MC. Accordingly, each of the plurality of word lines WL1 to WLm may be connected to at least one reference cell RC, at least one dummy cell DC and two or more memory cells MC.

According to an example embodiment illustrated with reference to FIG. 7, the plurality of reference cells RC are connected to a first bit line BL1 and a first source line SL1, and the plurality of dummy cells DC are connected to a second bit line BL2 and a second source line SL2. However, the disclosure is not necessarily limited to this arrangement. For example, the plurality of reference cells RC may be disposed in the middle of the memory cell array 310 in a direction in which the plurality of word lines WL1 to WLm are extended. The disposition and number of the plurality of dummy cells DC may also be variously modified according to example embodiments. Hereinafter, this modification is described in more detail with reference to FIGS. 8 and 9.

Figure 8:
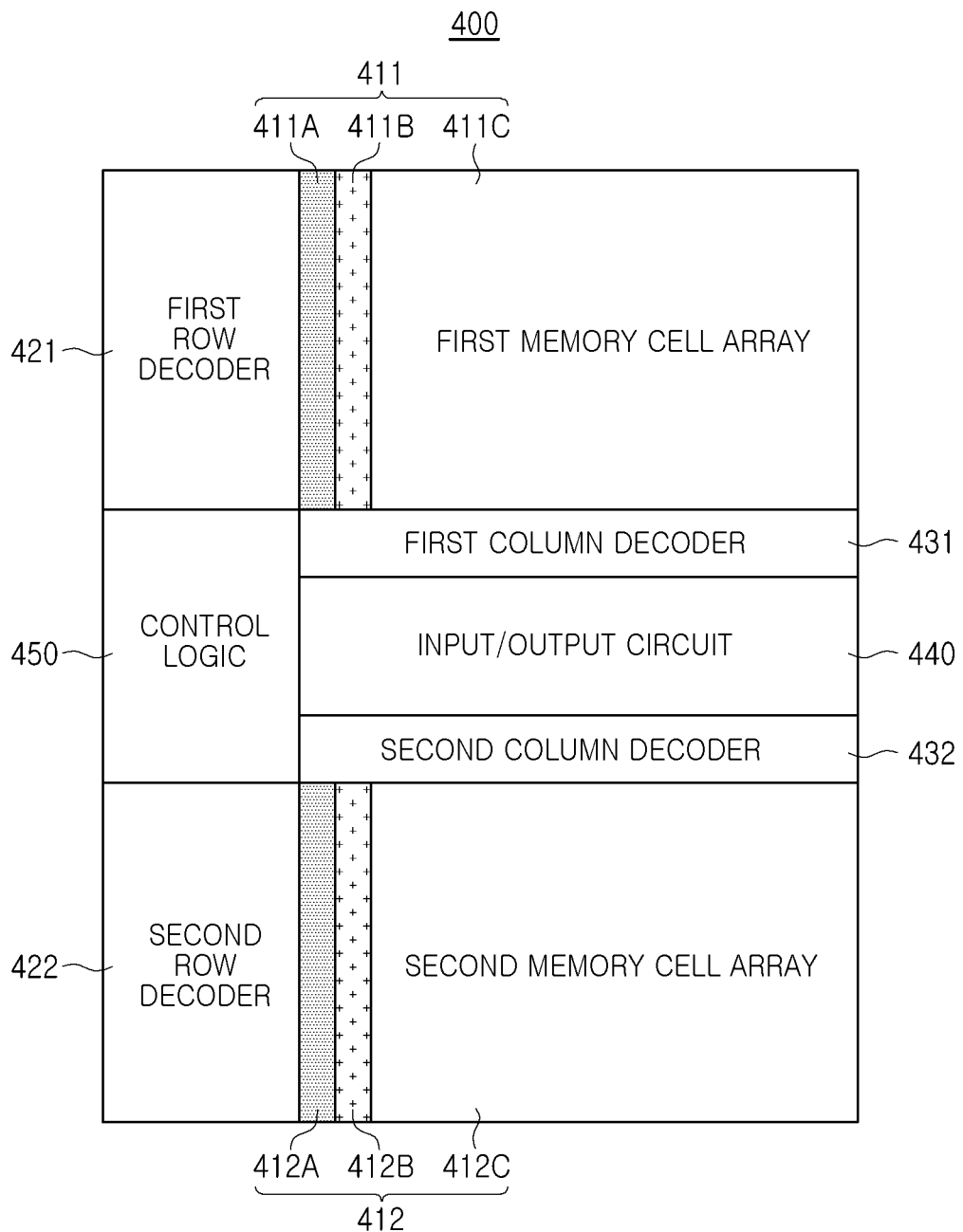
FIGS. 8 and 9 are diagrams illustrating a semiconductor device according to an example embodiment of the disclosure.
Figure 9:
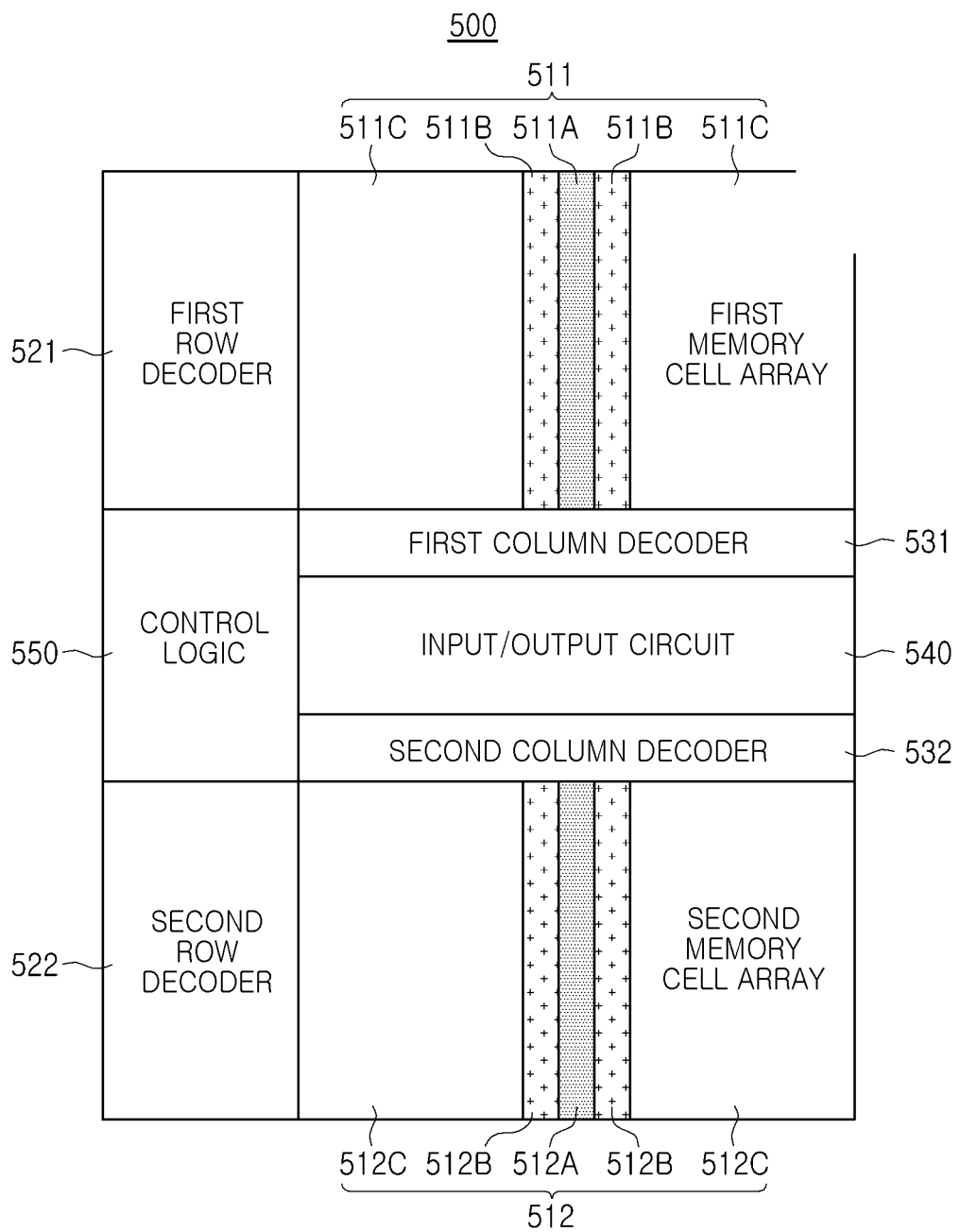

FIGS. 8 and 9 are diagrams illustrating a semiconductor device according to an example embodiment of the disclosure.

Referring to FIG. 8, a semiconductor device 400 according to an example embodiment of the disclosure may include memory cell arrays 411 and 412, row decoders 421 and 422, column decoders 431 and 432, an input/output circuit 440, a control logic 450. However, the disclosure is not limited thereto, and as such, according to another example embodiment, the semiconductor device 400 may include other components in addition to the components illustrated in FIG. 8. The row decoders 421 and 422 may be disposed on one side of the memory cell arrays 411 and 412, and the column decoders 431 and 432 and the input/output circuit 440 may be disposed between the memory cell arrays 411 and 412.

Each of the memory cell arrays 411 and 412 may include the plurality of reference cells, the plurality of dummy cells and the plurality of memory cells. The first memory cell array 411 may include a first reference cell region 411A in which a plurality of first reference cells are disposed, a first dummy cell region 411B in which a plurality of first dummy cells are disposed, a first memory cell region 411C in which a plurality of first memory cells are disposed, etc. Similarly, the second memory cell array 412 may include a second reference cell region 412A in which a plurality of second reference cells are disposed, a second dummy cell region 412B in which a plurality of second dummy cells are disposed, a second memory cell region 412C in which a plurality of second memory cells are disposed, etc.

As described above, reference cells in each of the memory cell arrays 411 and 412 may share one bit line with each other, and the dummy cells may share another bit line with each other. Accordingly, as shown in FIG. 8, the reference cell regions 411A and 412A and the dummy cell regions 411B and 412B may be extended in the first direction, which is a direction in which the bit lines are extended.

Referring to FIG. 8, the reference cell regions 411A and 412A and the dummy cell regions 411B and 412B may be disposed at the same position in each of the memory cell arrays 411 and 412 sharing the input/output circuit 440 with each other. The positions where the first reference cell region 411A and the first dummy cell region 411B are respectively disposed in the first memory cell array 411 may be the same as the positions where the second reference cell region 412A and the second dummy cell regions 412B are respectively disposed in second memory cell array 412.

In an example embodiment described with reference to FIG. 8, the reference cell regions 411A and 412A may be adjacent to the row decoders 421 and 422, and the dummy cell regions 411B and 412B may respectively be disposed between the reference cell regions 411A and 412A and the memory cell regions 411C and 412C. On the other hand, in an example embodiment described with reference to FIG. 9, reference cell regions 511A and 512A may respectively be disposed in the middle of memory cell arrays 511 and 512. In addition, dummy cell regions 511B and 512B may respectively be disposed on each of two sides of the reference cell regions 511A and 512A. A first reference cell region 511A and a first dummy cell region 511B may be disposed between first memory cell regions 511C, and a second reference cell region 512A and a second dummy cell region 512B may be disposed between second memory cell regions 512C. Accordingly, the number of the plurality of dummy cells included in the semiconductor device 500 according to an example embodiment described with reference to FIG. 9 may be more than the number of the plurality of dummy cells included in the semiconductor device 400 according to the example embodiment described with reference to FIG. 8.

According to an example embodiment described with reference to FIG. 9, the reference cell regions 511A and 512A and the dummy cell regions 511B and 512B may be disposed at the same position in each of the memory cell arrays 511 and 512. The positions where the first reference cell region 511A and the first dummy cell region 511B are respectively disposed in the first memory cell array 511 may be the same as the positions where the second reference cell region 512A and the second dummy cell regions 512B are respectively disposed in second memory cell array 512. However, the disclosure is not limited thereto, and as such, unlike the description made with reference to FIGS. 8 and 9, according to another example embodiment, the reference cells and the dummy cells may be disposed at different positions in each of the memory cell arrays 411 and 412 or 511 and 512 sharing the input/output circuit 440 or 540 with each other.

FIGS. 10 to 14 are diagrams illustrating an operation of a semiconductor device according to an example embodiment of the disclosure.

Figure 10:
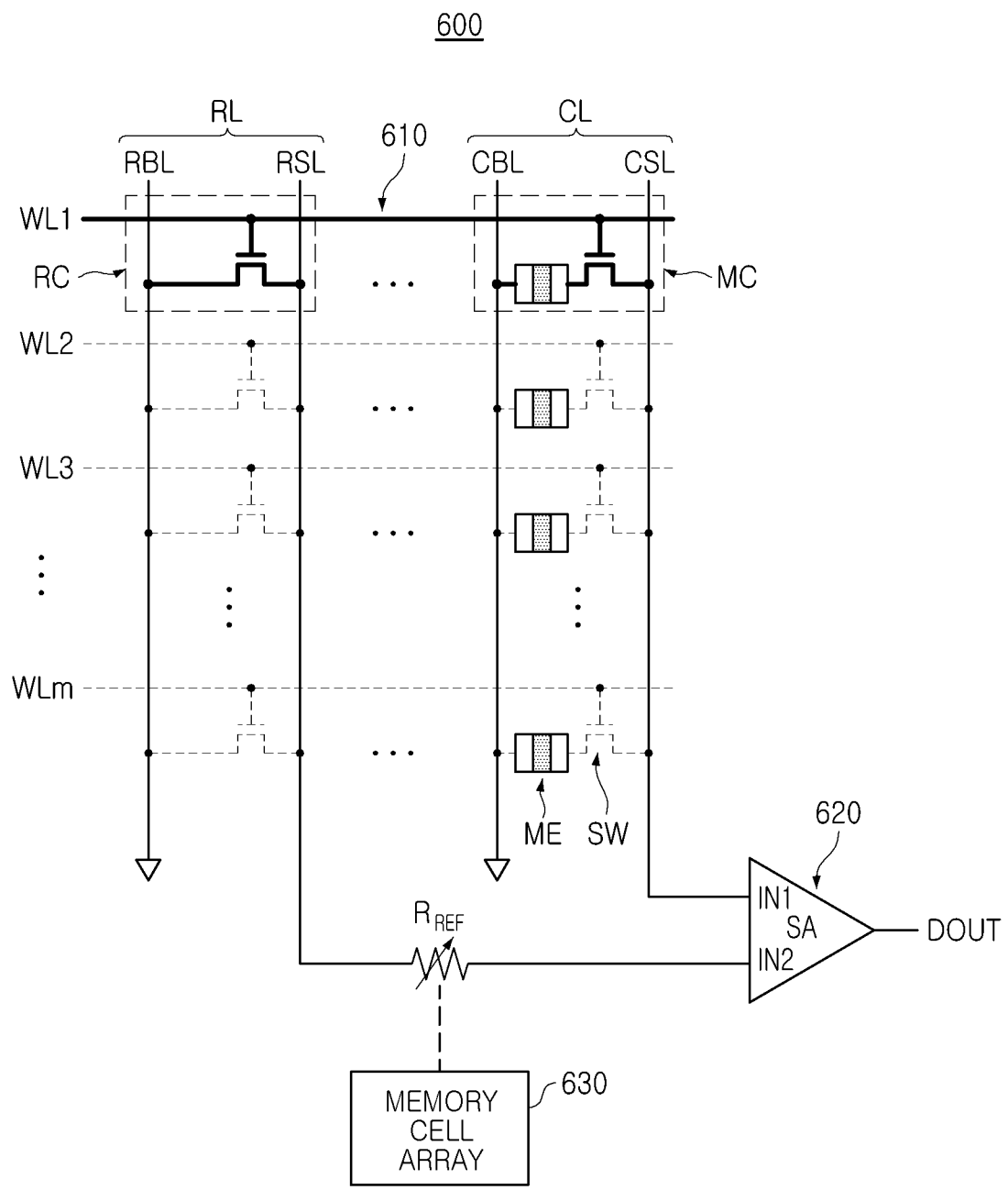
FIGS. 10 to 14 are diagrams illustrating an operation of a semiconductor device according to an example embodiment of the disclosure.

Referring to FIG. 10, a memory cell array 610 of a semiconductor device 600 may include the plurality of memory cells MC and the plurality of reference cells RC. The plurality of memory cells MC may include the switch element SW and the memory element ME, and the plurality of reference cells RC may include only the switch element SW. For instance, according to an example embodiment, the plurality of reference cells RC may not include a memory element ME.

The plurality of memory cells MC and the plurality of reference cells RC may share the plurality of word lines WL1 to WLm to each other. Accordingly, each of the plurality of word lines WL1 to WLm may be connected to at least one reference cell RC and at least one memory cell MC. Meanwhile, the plurality of reference cells RC may be connected to a reference line RL including a reference bit line RBL and a reference source line RSL, and the plurality of memory cells MC may be connected to a cell bit line CBL and a cell line CL including a cell source line CSL.

In the read operation, the selected memory cell of the plurality of memory cells MC may be connected to a first input terminal IN1 of a sense amplifier 620 through the cell line CL. In an example embodiment described with reference to FIG. 10, the selected memory cell may be connected to the first input terminal IN1 of the sense amplifier 620 through the cell source line CSL of the cell lines CL. Meanwhile, a second input terminal IN2 of the sense amplifier 620 may be connected to the reference line RL. Referring to FIG. 10, the reference source line RSL may be connected to the second input terminal IN2.

A turn-on voltage may be input to the first word line WL1, which is the selected word line connected to the selected memory cell, and a turn-off voltage may be input to the second to m-th word lines WL2 to WLm, which are remaining unselected word lines. In an ideal case, a cell current may flow through the selected memory cell connected to the first word line WL1 and no current may flow through the unselected memory cells connected to the second to m-th word lines WL2 to WLm. However, in the actual operation, the leakage current may flow through the unselected memory cells connected to the second to m-th word lines WL2 to WLm. Accordingly, the read current obtained by adding the cell current of the selected memory cell and the leakage current of the unselected memory cells may be input to the first input terminal IN1.

The reference current flowing through the plurality of reference cells RC and a reference resistor $R_{REF}$ may be input to the second input terminal IN2 of the sense amplifier 620. A resistance of the reference resistor $R_{REF}$ may be between the resistance when the fixed layer and the free layer of the memory element ME have the same magnetization direction and the resistance when the fixed layer and the free layer have opposite magnetization directions.

The sense amplifier 620 may output data DOUT based on a magnitude relationship between the read current input to the first input terminal IN1 and the reference current input to the second input terminal IN2, and the data DOUT may depend on the resistance of the memory element ME included in the selected memory cell. However, as described above, the leakage current flowing through the unselected memory cells connected to the second to m-th word lines WL2 to WLm may be included in the read current, and the output of the sense amplifier 620 may thus be changed due to the leakage current, which may lower the accuracy of the read operation.

For example, the leakage current may depend on the ambient temperature while the read operation is being executed. The leakage current may be increased as the temperature is increased. In addition, the resistance of the memory element ME may be reduced as the temperature is increased when the fixed layer and the free layer of the memory element ME of the selected memory cell have different magnetization directions. As a result, when the temperature is increased, the sense amplifier 620 may output incorrect data DOUT due to a reduced resistance and an increased leakage current of the memory element ME.

In order to solve this problem, the semiconductor device 600 according to an example embodiment of the disclosure may further connect dummy cells or memory cells disposed in the memory cell array 630 different from the memory cell array 610 to the second input terminal IN2 of the sense amplifier 620. Through the above operation, a compensation current flowing to the dummy cells or memory cells disposed in another memory cell array 630 may be input to the second input terminal IN2. Accordingly, the leakage current flowing to the unselected memory cells connected to the second to m-th word lines WL2 to WLm may be offset due to the compensation current input to the second input terminal IN2.

Another memory cell array 630 inputting the compensation current to the second input terminal IN2 may not share the word lines WL1 to WLm with the memory cell array 610. Accordingly, the plurality of dummy cells inputting the compensation current to the second input terminal IN2 may be disconnected from the selected word line WL1. On the other hand, one of the plurality of reference cells RC connected to the second input terminal IN2 may be connected to the selected word line WL1.

Figure 11:
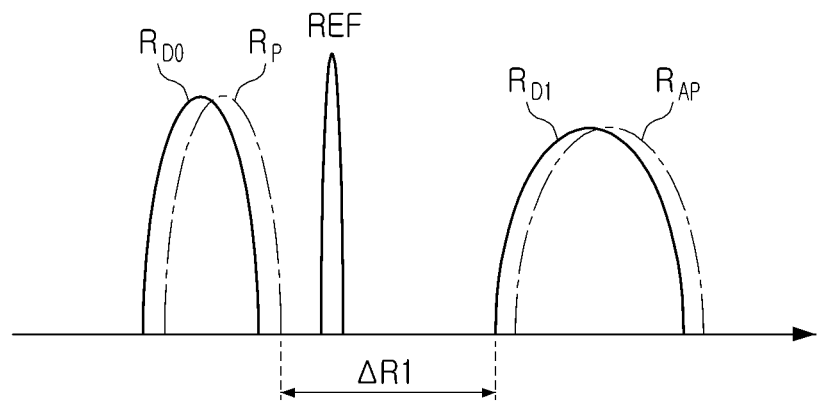
Figure 12:
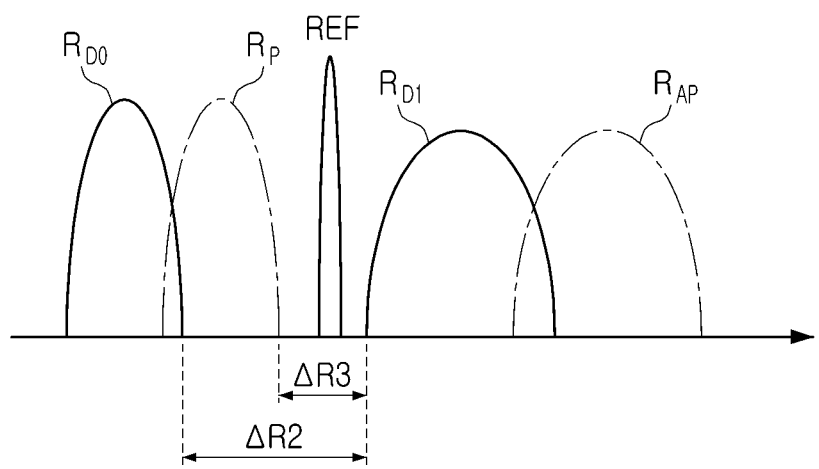

FIGS. 11 and 12 each show a graph illustrating a resistance distribution of each memory cell MC under different temperature conditions when another memory cell array 630 is not connected thereto. In the graphs shown in FIGS. 11 and 12, the reference resistance REF may be a resistance detected at the second input terminal IN2 of the sense amplifier 620. When another memory cell array 630 is not connected, the reference resistance REF may be maintained constant regardless of temperature.

First, FIG. 11 may be a graph illustrating the resistance distribution of each memory cell MC under a general temperature condition, for example, a room temperature condition. The memory element ME may have a first element resistance $R_P$ when the magnetization directions of the fixed layer and the free layer of the memory element ME included in each memory cell MC are the same as each other. On the other hand, the memory element ME may have a second element resistance $R_{AP}$ when the magnetization directions of the fixed layer and the free layer of the memory element ME are opposite to each other. The second element resistance $R_{AP}$ may be greater than the first element resistance $R_P$.

However, due to the effect of the leakage current, the resistance detected at the first input terminal IN1 of the sense amplifier 620 may be different from the first element resistance $R_P$ and the second element resistance $R_{AP}$. Referring to FIG. 11, the resistance detected at the first input terminal IN1 may be a first input resistance $R_{D0}$ or a second input resistance $R_{D1}$. The first input resistance $R_{D0}$ may be smaller than the first element resistance $R_P$ due to the leakage current. Similarly, the second input resistance $R_{D1}$ may be smaller than the second element resistance $R_{AP}$ due to the leakage current.

FIG. 12 shows a graph illustrating a resistance distribution of each memory cell MC under a temperature condition higher than the room temperature. Similarly to FIG. 11, the memory element ME may have the first element resistance $R_P$ when the magnetization directions of the fixed layer and the free layer of the memory element ME are same as each other. On the other hand, the memory element ME may have the second element resistance $R_{AP}$ which is greater than the first element resistance $R_P$ when the magnetization directions of the fixed layer and the free layer of the memory element ME are opposite to each other.

In the temperature condition higher than the room temperature, the magnitude of the leakage current may be increased as described above, and simultaneously, the resistance of the memory element ME may be reduced. Accordingly, referring to FIG. 12, a difference between the first input resistance $R_{D0}$ and the first element resistance $R_P$ and a difference between the second input resistance $R_{D1}$ and the second element resistance $R_{AP}$ may be increased compared to those of an example embodiment described with reference to FIG. 11.

When the semiconductor device 600 executes the read operation under the room temperature conditions, a first resistance margin $\Delta R1$ may be secured as shown in FIG. 11. On the other hand, the resistance margin may be changed to a second resistance margin $\Delta R2$ under a high temperature condition, and as a result, the resistance margin in the entire temperature range may be reduced to a third resistance margin $\Delta R3$.

According to an example embodiment of the disclosure, in the read operation of the semiconductor device 600, the second input terminal IN2 of the sense amplifier 620 may be connected to at least one of the bit line and source line of another memory cell array 630 not including the selected memory cell to compensate for the effect of the leakage current. Here, the word line connected to the another memory cell array 630 may all maintain a turn-off state, and the second input terminal IN2 may be connected to at least one of the bit line and source line, connected to the dummy cells or memory cells of another memory cell array other than the reference cells of the another memory cell array.

Accordingly, the leakage current flowing through the dummy cells or memory cells which includes both the switch element SW and the memory element ME and in which the switch element SW maintains the turned-off state may be added to the second input terminal IN2 of the sense amplifier 620. The leakage current added to the second input terminal IN2 may correspond to the leakage current flowing to the unselected memory cells connected to the second to m-th word lines WL2 to WLm of the memory cell array 610, and as a result, the resistance margin may be increased to improve the accuracy of the read operation.

Figure 13:
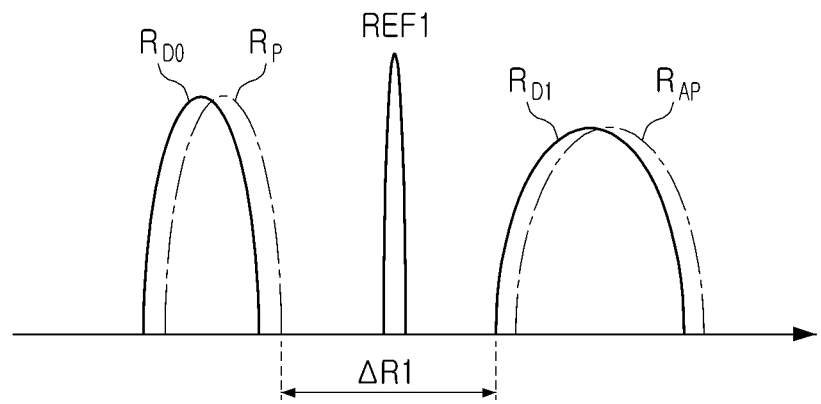
Figure 14:
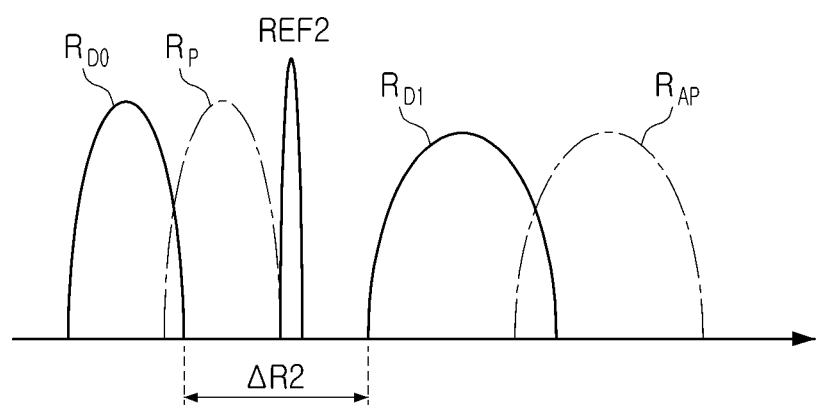

FIGS. 13 and 14 each show a graph illustrating a resistance distribution of each memory cell MC under different temperature conditions when another memory cell array 630 is connected to the second input terminal IN2 of the sense amplifier 620. First, FIG. 13 shows a graph illustrating the resistance distribution of each memory cell MC under the room temperature. The memory element ME may have the first element resistance $R_P$ when the magnetization directions of the fixed layer and the free layer of the memory element ME are the same as each other. On the other hand, the memory element ME may have the second element resistance $R_{AP}$ which is greater than the first element resistance $R_P$ when the magnetization directions of the fixed layer and the free layer of the memory element ME are opposite to each other.

However, due to the effect of the leakage current, the resistance detected at the first input terminal IN1 of the sense amplifier 620 may be different from the first element resistance $R_P$ and the second element resistance $R_{AP}$. Referring to FIG. 13, the resistance detected at the first input terminal IN1 may be the first input resistance $R_{D0}$ or the second input resistance $R_{D1}$. The first input resistance $R_{D0}$ may be smaller than the first element resistance $R_P$ due to the leakage current. Similarly, the second input resistance $R_{D1}$ may be smaller than the second element resistance $R_{AP}$ due to the leakage current. Accordingly, the first resistance margin $\Delta R1$ under the room temperature condition may be in a range between a minimum value of the second input resistance $R_{D1}$ and a maximum value of the first element resistance $R_P$.

However, the resistance margin may be reduced when the read operation is executed at the high temperature where the leakage current is increased and the resistance of the memory element ME is reduced. Referring to FIG. 14, the first element resistance $R_P$ and the second element resistance $R_{AP}$ determined based on the magnetization directions of the fixed layer and the free layer of the memory element ME may be similar to those described with reference to FIG. 13.

However, under the temperature condition higher than the room temperature, the resistance of the memory element ME may be reduced while the magnitude of the leakage current is increased, and the difference between the first input resistance $R_{D0}$ and the first element resistance $R_P$ and the second input resistance $R_{D1}$ and the second element resistance $R_{AP}$ may thus be increased. Accordingly, the second resistance margin $\Delta R2$ in the high temperature condition may be shifted to a resistance smaller than the first resistance margin $\Delta R1$.

As described above, in an example embodiment of the disclosure, in the read operation, the dummy cells or memory cells of another memory cell array 630 may be connected to the second input terminal IN2 of the sense amplifier 620, thereby changing the resistance of the reference resistor $R_{REF}$. Here, the word line connected to another memory cell array 630 may be biased to the turn-off voltage. In other words, the switch element of each of the dummy cells or memory cells of another memory cell array 630 may all be set to a turn-off state.

The leakage current flowing through another memory cell array 630 connected to the second input terminal IN2 may also be increased based on the temperature. As shown in FIGS. 13 and 14, in an example embodiment of the disclosure, the magnitude of the leakage current added to the second input terminal IN2 may be changed based on the temperature, and as a result, the resistance of the reference resistor $R_{REF}$ may be changed based on the temperature. Referring to FIGS. 13 and 14, the reference resistor $R_{REF}$ may have a first reference resistance REF1 at a relatively low temperature, and the reference resistor $R_{REF}$ may have second reference resistance REF2 smaller than the first reference resistance REF1 at a relatively high temperature. Accordingly, it is possible to increase the resistance margin in the entire temperature range, improve the accuracy of the read operation and improve the performance of the semiconductor device 600.

Figure 15:
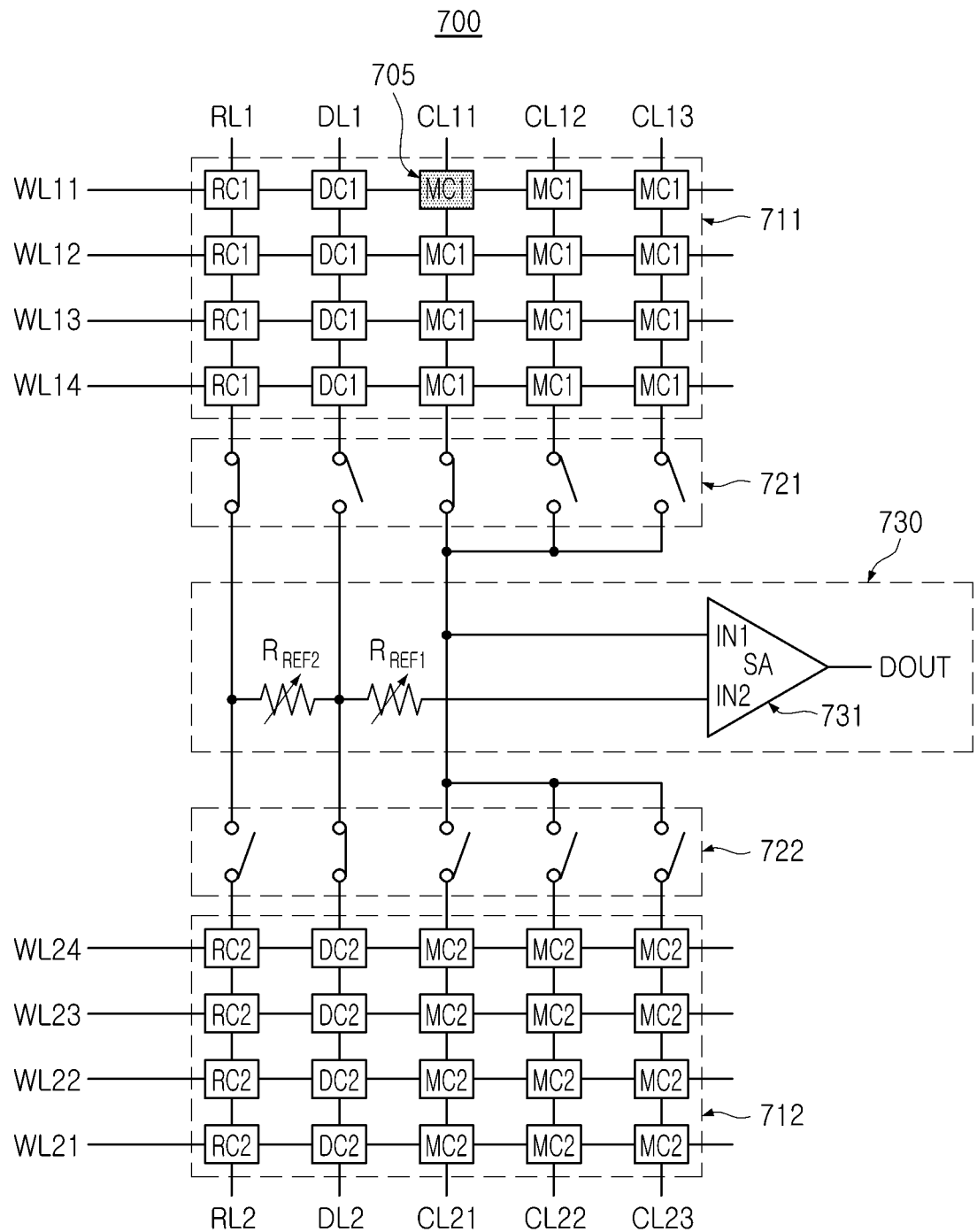
FIG. 15 is a diagram illustrating an operation of a semiconductor device according to an example embodiment of the disclosure.

FIG. 15 is a diagram illustrating an operation of a semiconductor device according to an example embodiment of the disclosure.

Referring to FIG. 15, a semiconductor device 700 according to an example embodiment of the disclosure may include a first memory cell array 711, a second memory cell array 712, a first column decoder 721, a second column decoder 722, an input/output circuit 730 and the like. The first memory cell array 711 may include a plurality of first reference cells RC1, a plurality of first dummy cells DC1 and a plurality of first memory cells MC1. Meanwhile, the second memory cell array 712 may include a plurality of second reference cells RC2, a plurality of second dummy cells DC2 and a plurality of second memory cells MC2.

Each of the first column decoder 721 and the second column decoder 722 may include a plurality of switches, and the plurality of switches may be connected to the first memory cell array 711 and the second memory cell array 712. For example, the switches of the first column decoder 721 may be connected to a first reference line RL1, a first dummy line DL1 and first cell lines CL11 to CL13. Meanwhile, the switches of the second column decoder 722 may be connected to a second reference line RL2, a second dummy line DL2 and second cell lines CL21 to CL23. Each of the reference lines RL1 and RL2, the dummy lines DL1 and DL2, and the cell lines CL11-CL13 and CL21-CL23 may include one bit line and one source line, and the bit line or the source line may respectively be connected to the switches.

Meanwhile, the first memory cell array 711 may be connected to a plurality of first word lines WL11 to WL14, and the second memory cell array 712 may be connected to a plurality of second word lines WL21 to WL24. The number of the plurality of first reference cells RC1, the plurality of first dummy cells DC1 and the plurality of first memory cells MC1, included in the first memory cell array 711, and the number of the plurality of second reference cells RC2, the plurality of second dummy cells DC2 and the plurality of second memory cells MC2, included in the second memory cell array 712, may be variously modified according to example embodiments.

Referring to FIG. 15, the read operation on the selected memory cell 705 may be executed. To execute the read operation, the turn-on voltage may be input to the first word line WL11 of the first memory cell array 711, and the turn-off voltage may be input to remaining word lines WL12 to WL14 and WL21 to WL24.

Meanwhile, a switch of the first column decoder 721, connected to the first cell line CL11 of the first memory cell array 711 may be turned on. Accordingly, the first cell line CL11 of the first memory cell array 711 may be connected to the first input terminal IN1 of the sense amplifier 731. A sum of the cell current flowing to the selected memory cell 705 and the leakage current flowing through the unselected memory cells sharing the first cell line CL11 with the selected memory cell 705 may be input to the first input terminal IN1 as the read current.

Meanwhile, the second input terminal IN2 of the sense amplifier 731 may be connected to the first reference resistor $R_{REF1}$ and the second reference resistance $R_{REF2}$, and the first reference line RL1 of the first memory cell array 711. In addition, a node between the first reference resistor $R_{REF1}$ and the second reference resistor $R_{REF2}$ may be connected to the second dummy line DL2 of the second memory cell array 712 through a switch of the second column decoder 722, which is turned on. Accordingly, the reference current obtained by adding the current flowing through the first reference line RL1 and the compensation current flowing through the second dummy line DL2 may be input to the second input terminal IN2. The plurality of first reference cells RC1 connected to the first reference line RL1 may be connected to the second input terminal IN2 through current paths different from the plurality of second dummy cells DC2 connected to the second dummy line DL2.

The dummy cells DC1 and DC2 may have the same structure as the memory cells MC1 and MC2, and the switch element included in each of the second dummy cells DC2 may maintain a turn-off state while the read operation is executed. Accordingly, the compensation current flowing through the second dummy line DL2 may have the same or similar magnitude as that of the leakage current flowing through the unselected memory cells connected to the first cell line CL11. In an example embodiment of the disclosure, the effect of the leakage current may be minimized by connecting the second dummy line DL2 to the second input terminal IN2 of the sense amplifier 731 to input a compensation current corresponding to the leakage current flowing through the unselected memory cells to the second input terminal IN2.

As described above, the magnitude of the leakage current may depend on an ambient condition such as the temperature. However, the magnitude of the compensation current flowing through the second dummy cells DC2 may also be changed similarly to the magnitude of the leakage current flowing through the unselected memory cells. Therefore, in an example embodiment of the disclosure, it is possible to reduce the effect of the leakage current and improve the accuracy of the read operation by inputting the compensation current which is changed in a similar trend to the leakage current to the second input terminal IN2 without any separate control such as adjusting the magnitude of the compensation current by detecting the temperature.

In some example embodiments, one of the second cell lines CL21 to CL23 other than the second dummy line DL2 may be connected to a node between the first reference resistor $R_{REF1}$ and the second reference resistor $R_{REF2}$. In the read operation on the selected memory cell 705, all of the second word lines WL21 to WL24 may be turned off, and one of the second cell lines CL21 to CL23 may thus be connected to the node between the first reference resistor $R_{REF1}$ and the second reference resistor $R_{REF2}$ to add the compensation current corresponding to the leakage current to the second input terminal IN2.

Resistances of the first and second reference resistors $R_{REF1}$ and $R_{REF2}$ may each be set so that the resistance detected at the second input terminal IN2 belongs to the resistance margin which may be changed based on the temperature. As described above with reference to FIGS. 13 and 14, the resistance margin may be determined as the first resistance margin $\Delta R1$, the second resistance margin $\Delta R2$ and the like based on the temperature. Each of the first and second reference resistors $R_{REF1}$ and $R_{REF2}$ may include a plurality of unit resistor and a plurality of transistors, and turning on/off of each of the plurality of transistors may be set in advance in the semiconductor device 700. Hereinafter, this configuration is described in detail with reference to FIG. 16.

Figure 16:
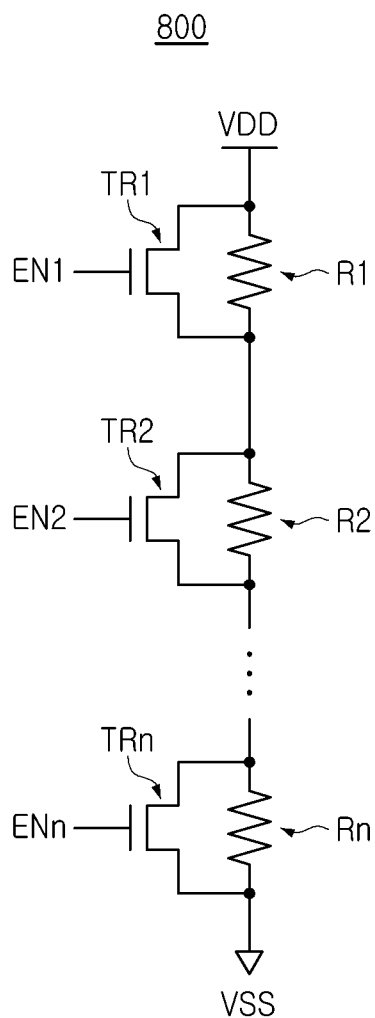
FIG. 16 is a diagram schematically illustrating a resistor circuit included in the semiconductor device according to an example embodiment of the disclosure.

FIG. 16 is a diagram schematically illustrating a resistor circuit included in the semiconductor device according to an example embodiment of the disclosure.

FIG. 16 is a circuit diagram illustrating a resistor circuit 800 which may be applied to the first reference resistor $R_{REF1}$ and the second reference resistor $R_{REF2}$ described above with reference to FIG. 15. Referring to FIG. 16, the resistor circuit 800 may include a plurality of unit resistors R1 to Rn and a plurality of transistors TR1 to TRn.

The plurality of transistors TR1 to TRn may be turned on/off by a plurality of enable signals EN1 to ENn. For example, turning on/off of each of the plurality of transistors TR1 to TRn may be predetermined before shipment of the semiconductor device. In an example embodiment, it is possible to select the resistance of each of the first reference resistor $R_{REF1}$ and the second reference resistor $R_{REF2}$ optimized for the resistance margin which may be changed based on the temperature in a test process performed after completing production of the semiconductor device.

Each of the first reference resistor $R_{REF1}$ and the second reference resistor $R_{REF2}$ may be provided by the separate resistor circuit 800. Each of the plurality of transistors TR1 to TRn included in the resistor circuit 800 may be turned on/off to obtain the resistance of each of the first and second reference resistors $R_{REF1}$ and $R_{REF2}$ optimized for the resistance margin.

Figure 17:
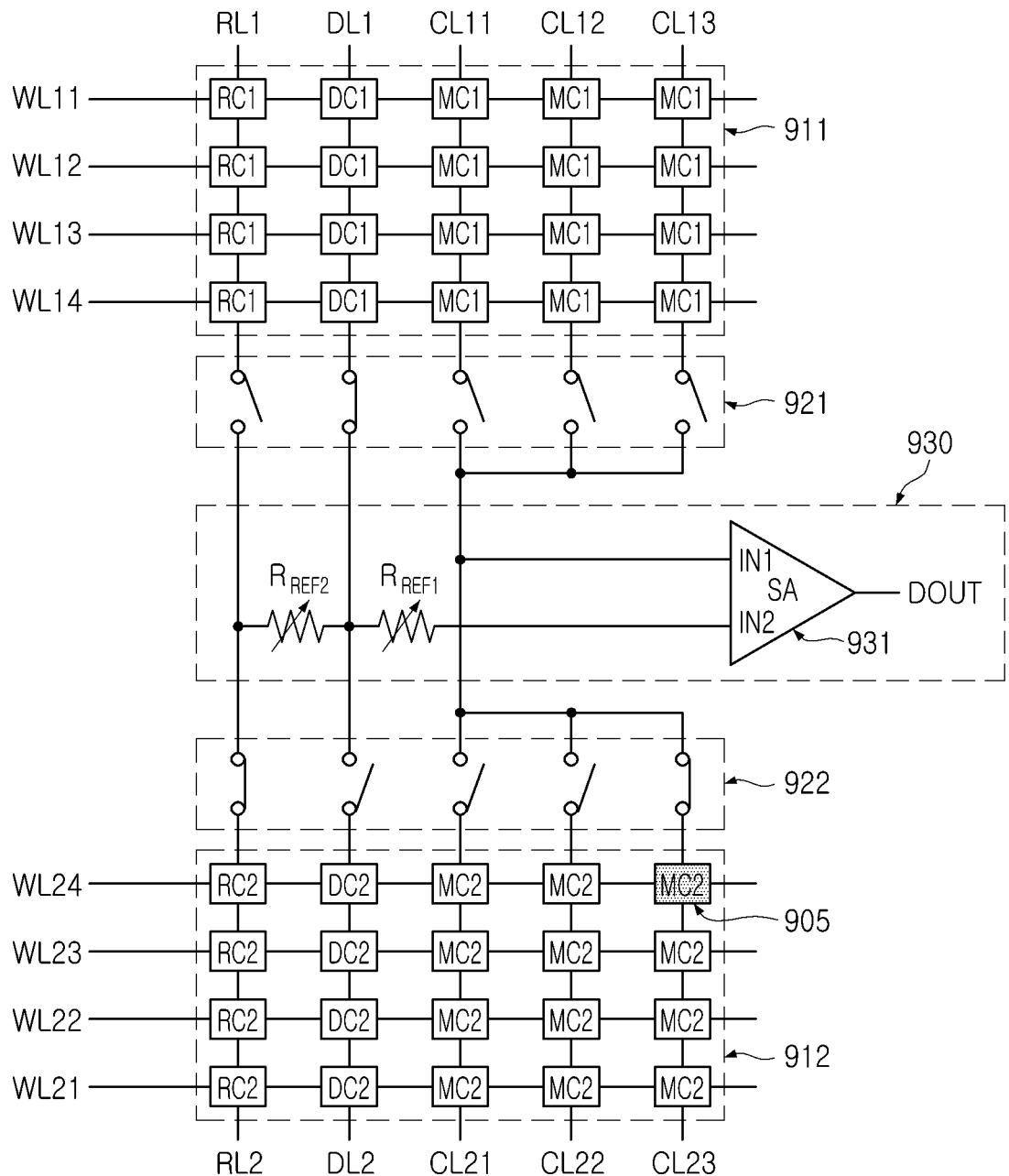
FIG. 17 is a diagram illustrating an operation of a semiconductor device according to an example embodiment of the disclosure.

FIG. 17 is a diagram illustrating an operation of a semiconductor device according to an example embodiment of the disclosure.

Referring to FIG. 17, a semiconductor device 900 according to an example embodiment of the disclosure may include a first memory cell array 911, a second memory cell array 912, a first column decoder 921, a second column decoder 922, an input/output circuit 930 and the like. The first memory cell array 911 may include the plurality of first reference cells RC1, the plurality of first dummy cells DC1 and the plurality of first memory cells MC1. Meanwhile, the second memory cell array 912 may include the plurality of second reference cells RC2, the plurality of second dummy cells DC2 and the plurality of second memory cells MC2.

Structures of the first column decoder 921, the second column decoder 922 and the input/output circuit 930 may be similar to those described above with reference to FIG. 15. However, in an example embodiment described with reference to FIG. 17, a selected memory cell 905 may be one of the second memory cells MC2 included in the second memory cell array 912. Accordingly, the third cell line CL23 of the second memory cell array 912 may be connected to the first input terminal IN1 of a sense amplifier 931, and the cell lines CL11 to CL13 of the first memory cell array 911 may be disconnected from the first input terminal IN1 of the sense amplifier 931.

Meanwhile, the second input terminal IN2 of the sense amplifier 931 may be connected to the second reference line RL2 of the second memory cell array 912 through the first reference resistor $R_{REF1}$ and the second reference resistor $R_{REF2}$. In addition, the node between the first reference resistor $R_{REF1}$ and the second reference resistor $R_{REF2}$ may be connected to the first dummy line DL1 of the first memory cell array 911 through a switch of the first column decoder 921, which is turned on. Accordingly, the reference current obtained by adding the current flowing through the second reference line RL2 and the compensation current flowing through the first dummy line DL1 may be input to the second input terminal IN2.

Similar to that described above with reference to FIG. 15, the compensation current flowing through the first dummy line DL1 may have the same or similar magnitude as that of the leakage current flowing through the unselected memory cells connected to the third cell line CL23. In an example embodiment of the disclosure, it is possible to effectively offset the effect of the leakage current by inputting the compensation current generated from the first dummy line DL1 to the second input terminal IN2 of the sense amplifier 931.

In some example embodiments, one of the first cell lines CL11 to CL13 other than the first dummy line DL1 may be connected to the node between the first reference resistor $R_{REF1}$ and the second reference resistor $R_{REF2}$. In the read operation on the selected memory cell 905, all of the first word lines WL11 to WL14 may be turned off, and one of the first cell lines CL11 to CL13 may thus be connected to the node between the first reference resistor $R_{REF1}$ and the second reference resistor $R_{REF2}$ to add the compensation current corresponding to the leakage current to the second input terminal IN2.

Figure 18:
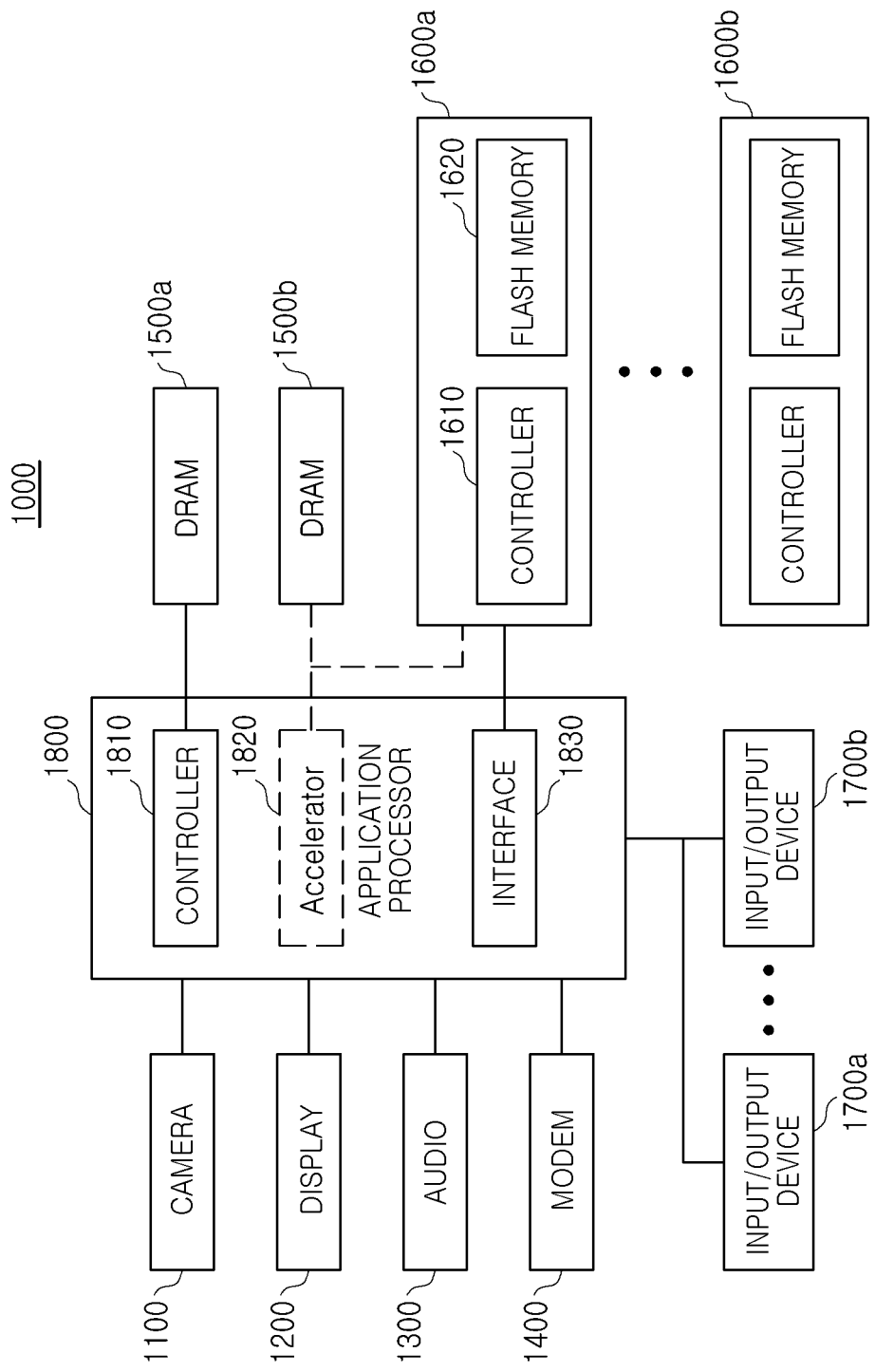
FIG. 18 is a block diagram schematically illustrating a system including the semiconductor device according to an example embodiment of the disclosure.

FIG. 18 is a block diagram schematically illustrating a system including the semiconductor device according to an example embodiment of the disclosure.

Referring to FIG. 18, a system 1000 may include a camera 1100, a display 1200, an audio processor 1300, a modem 1400, dynamic random access memories (DRAMs) 1500a and 1500b, flash memory devices 1600a and 1600b, an input/output device 1700a and 1700b and an application processor (hereinafter, "AP") 1800. In an example embodiment, the system 1000 may be a laptop computer, a portable terminal, a smartphone, a tablet PC, a wearable device, a healthcare device, an internet-of-things (IoT) device, a server or a personal computer.

The camera 1100 may capture a still image or a video depending on a control of a user. The system 1000 may obtain specific information by using the still image/video captured by the camera 1100 or convert the still image/video to another type of data such as a text and store the same. Alternatively, the system 1000 may identify a character string included in the still image/video captured by the camera 1100, and provide a text or audio translation corresponding to the character string.

The display 1200 may be implemented in various forms such as a liquid crystal display (LCD), an organic light emitting diodes (OLED) display, an active-matrix organic light-emitting diode (AM-OLED), a plasma display panel (PDP), a field emission display (FED) or and electronic paper. In an example embodiment, the display 1200 may provide a touch screen function to be used as an input device of the system 1000. In addition, the display 1200 may be formed integrally with a fingerprint sensor and the like to provide a security function of the system 1000.

The audio processor 1300 may process audio data stored in the flash memory devices 1600a and 1600b or audio data included in content received externally through the modem 1400, the input/output devices 1700a and 1700b or the like. For example, the audio processor 1300 may perform various processes such as coding/decoding, amplification and noise filtering on the audio data.

The modem 1400 may modulate and transmit a signal for transmitting and receiving wired/wireless data, and demodulate a signal received from the outside to restore an original signal. The input/output devices 1700a and 1700b may be devices that provide digital input/output, and may include a port which may be connected to an external recording medium, an input device such as a touch screen or a mechanical button key, an output device which may output vibration in a haptic manner or the like, etc. In some example embodiments, the input/output devices 1700a and 1700b may be connected to the external recording medium through a port such as a universal serial bus (USB), a lightning cable, a secure digital (SD) card, a micro SD card, a digital versatile disk (DVD), a network adapter or the like.

The AP 1800 may control an overall operation of the system 1000. In detail, the AP 1800 may control the display 1200 to display a portion of the content stored in the flash memory devices 1600a and 1600b on a screen. In addition, when a user input is received through the input/output devices 1700a and 1700b, the AP 1800 may perform a control operation corresponding to the user input.

The AP 1800 may be provided as a system-on-chip (SoC) that drives an application program, an operating system (OS) and the like. In addition, the AP 1800 may be included in one semiconductor package with other devices included in the system 1000, for example, the DRAM 1500a, a flash memory 1620, and/or a memory controller 1610.

In an example embodiment, the AP 1800 may include an accelerator block 1820 that is a dedicated circuit for data operation of an artificial intelligence (AI). Alternatively, in some example embodiments, a separate accelerator chip may be provided separately from the AP 1800, and the DRAM 1500b may be additionally connected to the accelerator block 1820 or the accelerator chip. The accelerator block 1820 may be a function block that professionally performs a specific function of the AP 1800, and may include a graphics processing unit (GPU) which is a function block that professionally performs graphic data processing, a neural processing unit (NPU) which is a block that professionally performs an AI calculation and inference, a data processing unit (DPU), which is a block that professionally performs a data transmission or the like. Also, the AP 1800 may include an interface 1830 communicating with other elements included in the system 1000.

In some example embodiments, the system 1000 may include the plurality of DRAMs 1500a and 1500b. In an example embodiment, the AP 1800 may include a controller 1810 controlling the DRAMs 1500a and 1500b, and the DRAM 1500a may be directly connected to the AP 1800. FIG. 18 shows only the DRAMs 1500a and 1500b. However, a configuration of the system 1000 is not necessarily limited to such a form, and a memory other than the DRAMs 1500a and 1500b may be included in the system 1000, based on the bandwidth, response speed and voltage condition of the AP 1800 or accelerator block 1820. For example, the controller 1810 and/or the accelerator block 1820 may control various memories such as a parameter random access memory (parameter RAM, PRAM), a static RAM (SRAM), a Magnetic RAM (MRAM), resistive RAM (RRAM), a ferroelectric RAM (FRAM), a hybrid RAM and the like. Alternatively, at least some of the DRAMs 1500*a* and 1500*b* may be replaced with PRAM, MRAM, RRAM or the like.

The system 1000 may include a plurality of storage devices having a capacity greater than those of the DRAMs 1500*a* and 1500*b* or the plurality of flash memory devices 1600*a* and 1600*b*. The flash memory devices 1600*a* and 1600*b* may include the controller 1610 and the flash memory 1620. The controller 1610 may receive a control command, data and the like from the AP 1800, record data to the flash memory 1620 in response to the control command or read data stored in the flash memory 1620 to transmit the same to the AP 1800. In some example embodiments, at least some of the flash memory devices 1600*a* and 1600*b* may also be replaced with PRAM, MRAM, RRAM or the like.

As set forth above, according to the example embodiments of the disclosure, it is possible to compensate for the leakage current affecting the read operation on the selected memory cell by using the current flowing through the selected memory cell array including the selected memory cell and the dummy cells of another unselected memory cell array. Therefore, it is possible to improve the reliability and performance of the memory device by improving the accuracy of the read operation.

While example embodiments have been shown and described above, it will be apparent to those skilled in the art that modifications and variations could be made without departing from the scope of the disclosure as defined by the appended claims.

What is claimed is:

1. A semiconductor device comprising:
   a first memory cell array comprising a plurality of first memory cells, a plurality of first reference cells and a plurality of first dummy cells;
   a second memory cell array comprising a plurality of second memory cells, a plurality of second reference cells and a plurality of second dummy cells;
   an input/output circuit provided between the first memory cell array and the second memory cell array;
   a first column decoder configured to electrically connect the first memory cell array and the input/output circuit; and
   a second column decoder configured to electrically connect the second memory cell array and the input/output circuit,
   wherein the second column decoder is configured to connect at least one of the plurality of second dummy cells and the plurality of second memory cells to a selected sense amplifier, among a plurality of sense amplifiers of the input/output circuit, when the first column decoder connects a selected first memory cell, among the plurality of first memory cells, to the selected sense amplifier.

2. The semiconductor device of claim 1, wherein the input/output circuit is provided between the first memory cell array and the second memory cell array in a first direction,
   the first column decoder is provided between the first memory cell array and the input/output circuit in the first direction, and
   the second column decoder is provided between the second memory cell array and the input/output circuit in the first direction.

3. The semiconductor device of claim 2, wherein the plurality of first dummy cells are provided between one or more of the plurality of first memory cells and the plurality of first reference cells in a second direction intersecting the first direction, and
   the plurality of second dummy cells are provided between one or more of the plurality of second memory cells and the plurality of second reference cells in the second direction.

4. The semiconductor device of claim 1, wherein a first position of the plurality of first reference cells in the first memory cell array is same as a second position of the plurality of second reference cells in the second memory cell array.

5. The semiconductor device of claim 1, wherein a third position of the plurality of first dummy cells in the first memory cell array is same as a fourth position of the plurality of second dummy cells in the second memory cell array.

6. The semiconductor device of claim 1, wherein each of the plurality of first memory cells, each of the plurality of second memory cells, each of the plurality of first dummy cells and each of the plurality of second dummy cells includes a switch element and a memory element, and
   wherein none of the plurality of first reference cells and the plurality of second reference cells includes the memory element.

7. The semiconductor device of claim 1, wherein the first column decoder is further configured to connect a selected first bit line connected to the selected first memory cell to a first input terminal of the selected sense amplifier, and connect a selected first reference bit line connected to a selected first reference cell, among the plurality of first reference cells, to a second input terminal of the selected sense amplifier, and
   the second column decoder is further configured to connect a selected second dummy bit line connected to a selected second dummy cell, among the plurality of second dummy cells, to the second input terminal of the selected sense amplifier.

8. The semiconductor device of claim 7, wherein a first reference current flowing through the selected first reference bit line and a second dummy current flowing through the selected second dummy bit line are input to the second input terminal of the selected sense amplifier.

9. The semiconductor device of claim 1, wherein each of the plurality of first memory cells and the plurality of second memory cells includes a magnetic tunnel junction (MTJ) element.

10. The semiconductor device of claim 1, further comprising a first row decoder connected to the first memory cell array through a plurality of first word lines, and a second row decoder connected to the second memory cell array through a plurality of second word lines.

11. The semiconductor device of claim 10, wherein the first row decoder is configured to input a selected voltage to a selected first word line, among the plurality of first word lines, connected to the selected first memory cell, and not input the the selected voltage to remaining first word lines among the plurality of first word lines, and
    the second row decoder is configured to not input the selected voltage to the plurality of second word lines.

12. A semiconductor device comprising:
a memory cell array including a plurality of memory cells and a plurality of reference cells, the plurality of reference cells having a first structure different from a second structure of the plurality of memory cells;
a column decoder connected to the plurality of memory cells through a plurality of bit lines extended in a first direction, and connected to the plurality of reference cells through a plurality of reference bit lines extended in the first direction; and
an input/output circuit including at least one sense amplifier connected to the memory cell array through the column decoder,
wherein the sense amplifier includes a first input terminal configured to connect to a selected bit line, among the plurality of bit lines through the column decoder, and a second input terminal configured connect to a selected reference bit line, among the plurality of reference bit lines, through the column decoder,
wherein the second input terminal is configured to connect to the selected reference bit line through a first reference resistor and a second reference resistor, and
wherein a dummy bit line, other than the plurality of bit lines and the plurality of reference bit lines, is configured to be connected to a node between the first reference resistor and the second reference resistor.

13. The semiconductor device of claim 12, wherein each of the first reference resistor and the second reference resistor includes a plurality of resistors connected in series with each other, and a plurality of switches, and
each of the plurality of switches is connected in parallel with one of the plurality of resistors.

14. The semiconductor device of claim 12, wherein a first resistance of the first reference resistor is greater than a second resistance of the second reference resistor.

15. The semiconductor device of claim 14, wherein a third resistance of each of the plurality of memory cells is in a first range corresponding to first data or a second range corresponding to second data different from the first data, and
the first resistance of the first reference resistor is greater than a maximum value of the first range and smaller than a maximum value of the second range.

16. The semiconductor device of claim 12, wherein the dummy bit line is connected to a plurality of dummy cells included in another memory cell array other than the memory cell array.

17. The semiconductor device of claim 16, wherein each of the plurality of memory cells and the plurality of dummy cells includes a switch element and a magnetic tunnel junction (MTJ) element, and
none of the plurality of reference cells includes the MTJ element.

18. A semiconductor device comprising:
a plurality of memory cells each including a switch element and a memory element;
a plurality of reference cells having a first structure different than a second structure of the plurality of memory cells;
a plurality of dummy cells having a third structure same as the second structure of plurality of memory cells; and
a sense amplifier having a first input terminal configured to connect to a selected memory cell and a second input terminal configured to connect to the plurality of reference cells and the plurality of dummy cells, during a read operation for the selected memory cell, among the plurality of memory cells,
wherein a selected word line connected to the selected memory cell is connected to one of the plurality of reference cells and disconnected from the plurality of dummy cells.

19. The semiconductor device of claim 18, wherein the plurality of reference cells and the plurality of dummy cells are connected to the second input terminal through different current paths.

20. The semiconductor device of claim 18, wherein the plurality of reference cells, the plurality of dummy cells and the plurality of memory cells are provided at different positions in a direction in which the selected word line is extended.

* * * * *